United States Patent
Matthew et al.

(10) Patent No.: US 10,754,549 B2
(45) Date of Patent: *Aug. 25, 2020

(54) APPEND ONLY STREAMS FOR STORING DATA ON A SOLID STATE DEVICE

(71) Applicant: Microsoft Technology Licensing, LLC, Redmond, WA (US)

(72) Inventors: Bryan S. Matthew, Redmond, WA (US); Aaron W. Ogus, Redmond, WA (US); Vadim Makhervaks, Redmond, WA (US); Laura M. Caulfield, Redmond, WA (US); Rajsekhar Das, Redmond, WA (US); Scott Chao-Chueh Lee, Redmond, WA (US); Omar Carey, Redmond, WA (US); Madhav Pandya, Redmond, WA (US); Ioan Oltean, Redmond, WA (US); Garret Buban, Carnation, WA (US); Lee Prewitt, Mercer Island, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/993,355

(22) Filed: May 30, 2018

(65) Prior Publication Data

US 2018/0275889 A1     Sep. 27, 2018

Related U.S. Application Data

(60) Provisional application No. 62/631,323, filed on Feb. 15, 2018.

(51) Int. Cl.
G06F 3/06      (2006.01)
H03M 13/15     (2006.01)
(Continued)

(52) U.S. Cl.
CPC ............ *G06F 3/0608* (2013.01); *G06F 3/064* (2013.01); *G06F 3/0652* (2013.01);
(Continued)

(58) Field of Classification Search
CPC .... G06F 3/0608; G06F 3/0679; G06F 3/0652; G06F 3/064; H03M 13/453; H03M 13/152; H03M 13/6502; H03M 13/2963
See application file for complete search history.

(56) References Cited

U.S. PATENT DOCUMENTS 8,862,810 B2    10/2014   Lee et al.
9,110,594 B2     8/2015   Keeler et al.
(Continued)

OTHER PUBLICATIONS

Yang, Jingpei, et al. "AutoStream: automatic stream management for multi-streamed SSDs." Proceedings of the 10th ACM International Systems and Storage Conference. ACM, 2017. (Year: 2017).*
(Continued)

*Primary Examiner* — Francisco A Grullon
(74) *Attorney, Agent, or Firm* — BakerHostetler

(57) ABSTRACT

An append-only streams capability may be implemented that allows the host (e.g., the file system) to determine an optimal stream size based on the data to be stored in that stream. The storage device may expose to the host one or more characteristics of the available streams on the device, including but not limited to the maximum number of inactive and active streams on the device, the erase block size, the maximum number of erase blocks that can be written in parallel, and an optimal write size of the data. Using this information, the host may determine which particular stream offered by the device is best suited for the data to be stored.

20 Claims, 20 Drawing Sheets

(51) Int. Cl.
  *H03M 13/29* (2006.01)
  *H03M 13/00* (2006.01)
  *H03M 13/45* (2006.01)

(52) U.S. Cl.
  CPC ........ *G06F 3/0679* (2013.01); *H03M 13/152* (2013.01); *H03M 13/2963* (2013.01); *H03M 13/453* (2013.01); *H03M 13/6502* (2013.01)

(56) References Cited

U.S. PATENT DOCUMENTS

| | | | | |
|---|---|---|---|---|
| 9,304,903 | B2 | 4/2016 | Li | |
| 2010/0169588 | A1* | 7/2010 | Sinclair | G06F 12/0246 711/160 |
| 2011/0119462 | A1* | 5/2011 | Leach | G06F 12/0246 711/166 |
| 2012/0151157 | A1 | 6/2012 | Sela et al. | |
| 2013/0173842 | A1 | 7/2013 | Ng et al. | |
| 2013/0282955 | A1 | 10/2013 | Parker et al. | |
| 2016/0266792 | A1* | 9/2016 | Amaki | G06F 12/0246 |
| 2017/0060479 | A1* | 3/2017 | Hong | G06F 3/0679 |

OTHER PUBLICATIONS

H. Huen, C. Choi, and V. Balakrishnan. Performance and endurance enhancements with multi-stream ssds on apache cassandra. Samsung Semiconductor http://www.samsung.com/us/labs/collateral/index.html, 2017. (Year: 2017).*

Min, et al., "SFS: Random Write Considered Harmful in Solid State Drives", In Proceedings of the 10th USENIX conference on File and Storage Technologies, Feb. 14, 2012, 16 Pages.

"Write Amplification—Wikipedia", Retrieved from: https://en.wikipedia.org/w/index.php?title=Write_amplification&oldid=754352450, Dec. 12, 2016, 13 Pages.

"Non Final Office Action Issued in U.S. Appl. No. 15/628,994", dated Nov. 21, 2018, 16 Pages.

"Non Final Office Action Issued in U.S. Appl. No. 15/898,083", dated Nov. 19, 2018, 9 Pages.

"International Search Report and Written Opinion Issued in PCT Application No. PCT/US18/016937", dated Apr. 5, 2018, 11 Pages.

"Final Office Action Issued in U.S. Appl. No. 15/628,994", dated May 15, 2019, 14 Pages.

"International Search Report and Written Opinion Issued in PCT Application No. PCT/US19/016940", dated Apr. 26, 2019, 10 Pages.

"Non Final Office Action Issued in U.S. Appl. No. 15/628,994", dated Aug. 19, 2019, 15 Pages.

"Final Office Action Issued in U.S. Appl. No. 15/628,994", dated Mar. 6, 2020, 12 Pages.

* cited by examiner

APPEND ONLY STREAMS FOR STORING DATA ON A SOLID STATE DEVICE

BACKGROUND

Solid state devices (SSDs), such as flash storage, offer benefits over traditional hard disk drives (HDDs). For example, SSDs are often faster, quieter and draw less power than their HDD counterparts. However, there are also drawbacks associated with SSDs. For example, SSDs are limited in the sense that data can only be erased from the storage device in blocks, also known as "erase blocks." These blocks may contain, in addition to data that a user wishes to erase, important data that the user wishes to keep stored on the SSD. In order to erase the unwanted data, the SSD must perform a process known as "garbage collection" in order to move data around on the SSD so that important files are not accidentally deleted. However, this process may result in an effect known as "write amplification" where the same data is written to the physical media on the SSD multiple times, shortening the lifespan of the SSD. Streaming is a process by which data stored on the SSD may be grouped together in a stream comprising one or more erase blocks based, for example, on an estimated deletion time of all of the data in the stream. By storing data that is likely to be deleted together in the same erase block or group of erase blocks (i.e., the same stream), a number of the problems associated with SSD storage may be alleviated.

SUMMARY

Methods and systems are disclosed for optimizing the use of streams for storing data on a solid state device. An append-only streams capability may be implemented that allows the host (e.g., the file system) to determine an optimal stream size based on the data to be stored in that stream. The storage device may expose to the host one or more characteristics of the available streams on the device, including but not limited to the maximum number of inactive and active streams on the device, the erase block size, the maximum number of erase blocks that can be written in parallel, and an optimal write size of the data. Using this information, the host may determine which particular stream offered by the device is best suited for the data to be stored and/or may request that the device create a stream with one or more desired properties.

In one embodiment, a file system may determine a number of erase blocks required for storing data on the device. The required number of erase blocks may be determined based on the data to be stored on the device and a size of the one or more erase blocks of the device. The file system may send to the device a request for a stream identifier associated with a stream that comprises one or more characteristics (e.g., an optimal number of erase blocks for storing the data) and may receive from the device a corresponding stream identifier. The file system may then write to the stream using the stream identifier. By placing the burden on the host to determine the stream characteristics based on the data to be stored, the processing burdens on the storage device may be significantly reduced.

BRIEF DESCRIPTION OF THE DRAWINGS

The foregoing Summary, as well as the following Detailed Description, is better understood when read in conjunction with the appended drawings. In order to illustrate the present disclosure, various aspects of the disclosure are shown. However, the disclosure is not limited to the specific aspects discussed. In the drawings.

DETAILED DESCRIPTION

In one embodiment, methods and systems are disclosed for optimizing the number of stream writes to a storage device based, for example, on an amount of data associated with a given file and a size of available streams on the storage device. For example, a method may comprise writing data associated with a plurality of files to a first set of one or more erase blocks, determining that an amount of data associated with a given one of the plurality of files in the first set of one or more erase blocks has reached a threshold, and moving the data associated with the given file from the first set of one or more erase blocks to a stream, the stream comprising a second set of one or more erase blocks on the storage device different from the first set of one or more erase blocks.

In another embodiment, methods and systems are disclosed for optimizing the use of streams for storing data on a solid state device. An append-only streams capability may be implemented that allows the host (e.g., the file system) to determine an optimal stream size based on the data to be stored in that stream. The storage device may expose to the host one or more characteristics of the available streams on the device, including but not limited to the maximum number of inactive and active streams on the device, the erase block size, the maximum number of erase blocks that can be written in parallel, and an optimal write size of the data. Using this information, the host may determine which particular stream offered by the device is best suited for the data to be stored.

Figure 1:
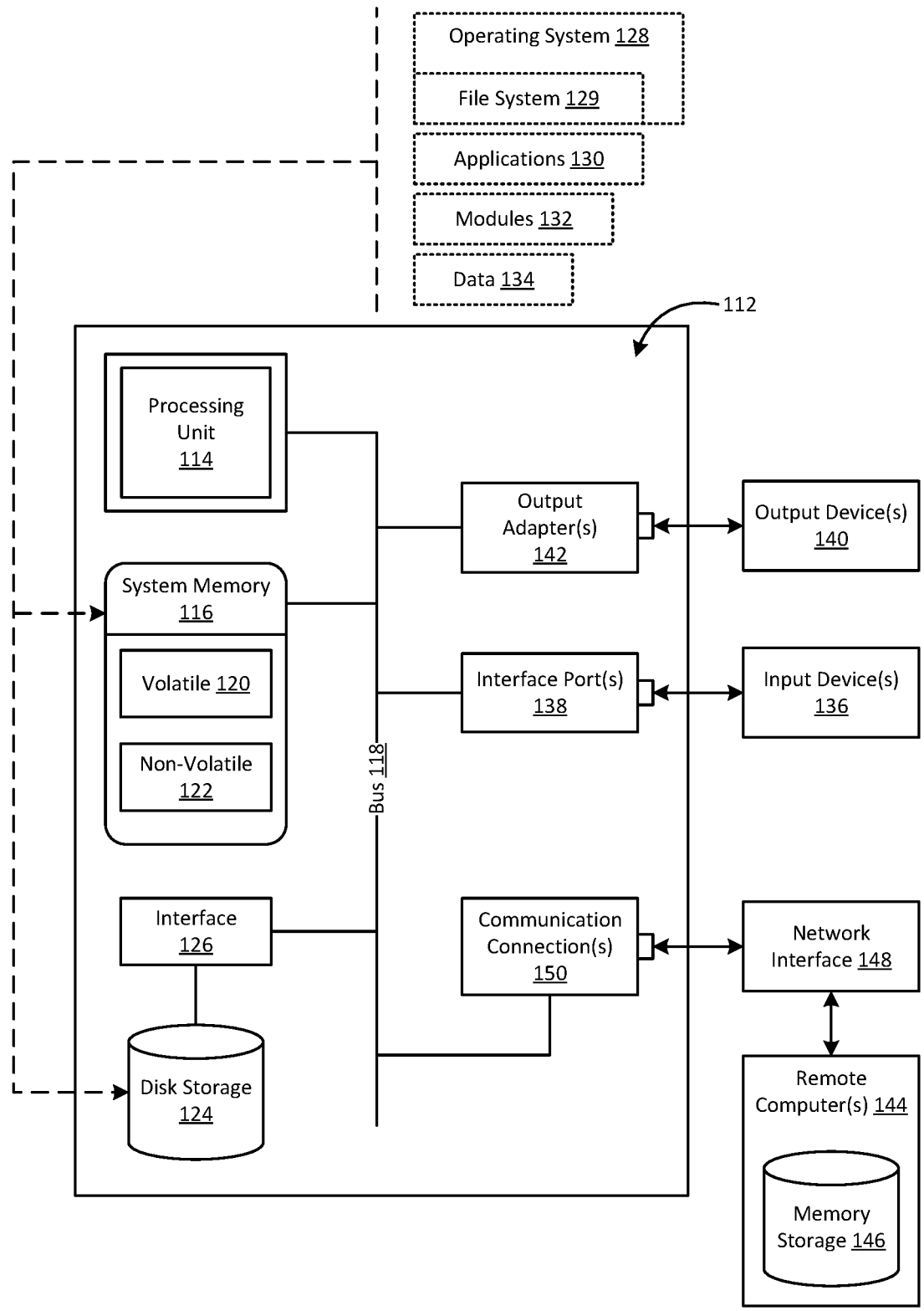
FIG. 1 illustrates an example computing device, in which the aspects disclosed herein may be employed.

FIG. 1 illustrates an example computing device 112 in which the techniques and solutions disclosed herein may be implemented or embodied. The computing device 112 may be any one of a variety of different types of computing devices, including, but not limited to, a computer, personal computer, server, portable computer, mobile computer, wearable computer, laptop, tablet, personal digital assistant, smartphone, digital camera, or any other machine that performs computations automatically.

The computing device 112 includes a processing unit 114, a system memory 116, and a system bus 118. The system bus 118 couples system components including, but not limited to, the system memory 116 to the processing unit 114. The processing unit 114 may be any of various available processors. Dual microprocessors and other multiprocessor architectures also may be employed as the processing unit 114.

The system bus 118 may be any of several types of bus structure(s) including a memory bus or memory controller, a peripheral bus or external bus, and/or a local bus using any variety of available bus architectures including, but not limited to, Industry Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 116 includes volatile memory 120 and nonvolatile memory 122. The basic input/output system (BIOS), containing the basic routines to transfer information between elements within the computing device 112, such as during start-up, is stored in nonvolatile memory 122. By way of illustration, and not limitation, nonvolatile memory 122 may include read only memory (ROM), programmable ROM (PROM), electrically programmable ROM (EPROM), electrically erasable ROM (EEPROM), or flash memory. Volatile memory 120 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computing device 112 also may include removable/non-removable, volatile/non-volatile computer-readable storage media. FIG. 1 illustrates, for example, secondary storage 124. Secondary storage 124 includes, but is not limited to, devices like a magnetic disk drive, floppy disk drive, tape drive, Jaz drive, Zip drive, LS-100 drive, memory card (such as an SD memory card), or memory stick. In addition, secondary storage 124 may include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the secondary storage 124 to the system bus 118, a removable or non-removable interface is typically used such as interface 126.

FIG. 1 further depicts software that acts as an intermediary between users and the basic computer resources described in the computing device 112. Such software includes an operating system 128. Operating system 128, which may be stored on secondary storage 124, acts to control and allocate resources of the computing device 112. Applications 130 take advantage of the management of resources by operating system 128 through program modules 132 and program data 134 stored either in system memory 116 or on secondary storage 124. It is to be appreciated that the aspects described herein may be implemented with various operating systems or combinations of operating systems. As further shown, the operating system 128 includes a file system 129 for storing and organizing, on the secondary storage 124, computer files and the data they contain to make it easy to find and access them.

A user may enter commands or information into the computing device 112 through input device(s) 136. Input devices 136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 114 through the system bus 118 via interface port(s) 138. Interface port(s) 138 include, for example, a serial port, a parallel port, a game port, and a universal serial bus (USB). Output device(s) 140 use some of the same type of ports as input device(s) 136. Thus, for example, a USB port may be used to provide input to computing device 112, and to output information from computing device 112 to an output device 140. Output adapter 142 is provided to illustrate that there are some output devices 140 like monitors, speakers, and printers, among other output devices 140, which require special adapters. The output adapters 142 include, by way of illustration and not limitation, video and sound cards that provide a means of connection between the output device 140 and the system bus 118. It should be noted that other devices and/or systems of devices provide both input and output capabilities such as remote computer(s) 144.

Computing device 112 may operate in a networked environment using logical connections to one or more remote computing devices, such as remote computing device(s) 144. The remote computing device(s) 144 may be a personal computer, a server, a router, a network PC, a workstation, a microprocessor based appliance, a peer device, another computing device identical to the computing device 112, or the like, and typically includes many or all of the elements described relative to computing device 112. For purposes of brevity, only a memory storage device 146 is illustrated with remote computing device(s) 144. Remote computing device(s) 144 is logically connected to computing device 112 through a network interface 148 and then physically connected via communication connection 150. Network interface 148 encompasses communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN)

and variations thereon, packet switching networks, and Digital Subscriber Lines (DSL).

Communication connection(s) 150 refers to the hardware/software employed to connect the network interface 148 to the bus 118. While communication connection 150 is shown for illustrative clarity inside computing device 112, it may also be external to computing device 112. The hardware/software necessary for connection to the network interface 148 includes, for exemplary purposes only, internal and external technologies such as modems including regular telephone grade modems, cable modems and DSL modems, ISDN adapters, and Ethernet cards.

As used herein, the terms "component," "system," "module," and the like are intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server may be a component. One or more components may reside within a process and/or thread of execution and a component may be localized on one computer and/or distributed between two or more computers.

Figure 2:
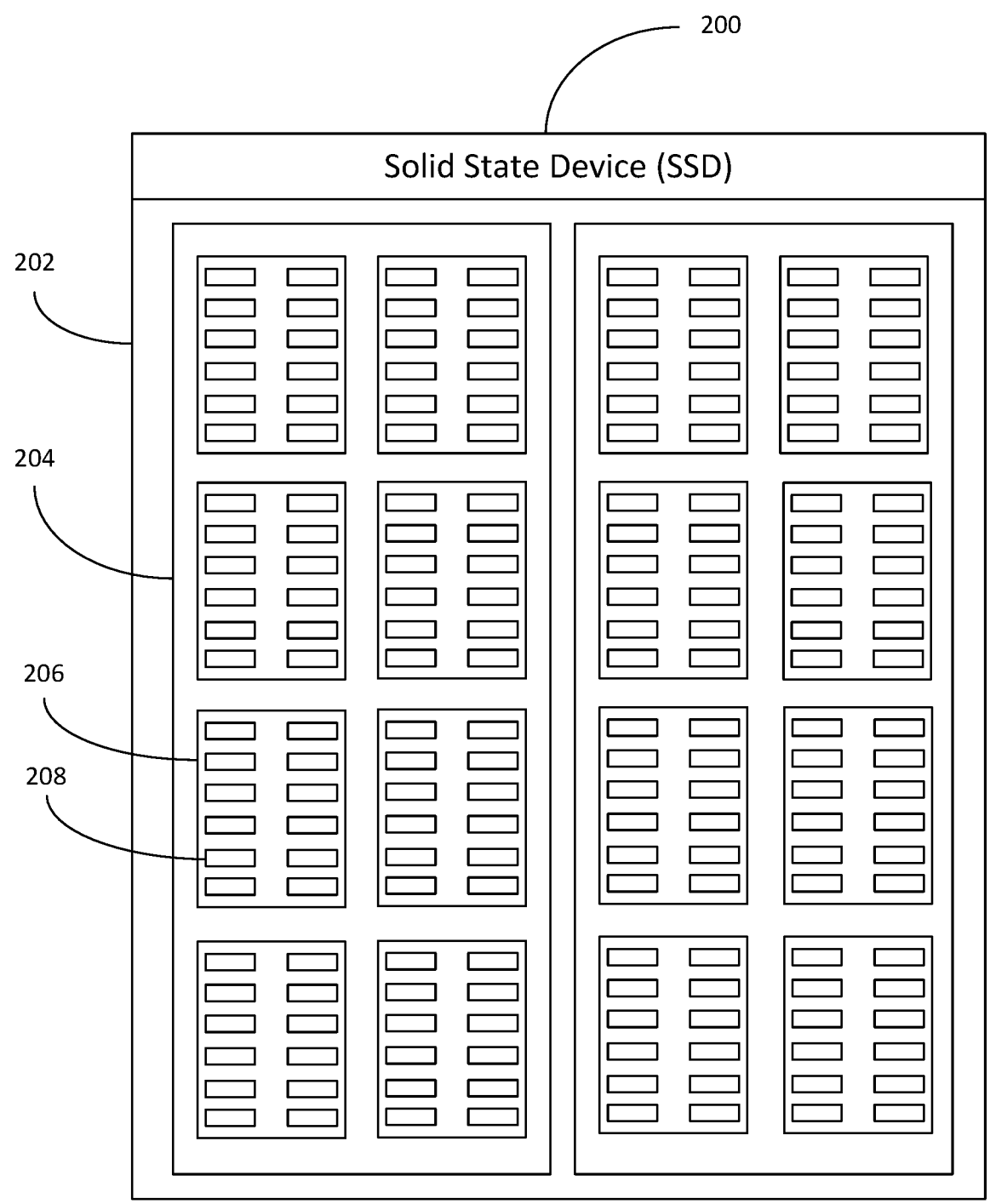
FIG. 2 illustrates an example solid state device (SSD)

FIG. 2 illustrates an example solid state device (SSD) 200. The SSD illustrated in FIG. 2 may be, for example, a NAND flash storage device. The SSD 200 may, for example, be used to implement the secondary storage 124 of the example computing device shown in FIG. 1. As shown, the SSD may comprise a die 202. A die may represent the smallest unit of the SSD that can independently execute commands. While the SSD in FIG. 2 comprises only a single die, it is understood that an SSD may comprise any number of die. As further shown in FIG. 2, each die may comprise one or more planes 204. An SSD may typically comprise one or two planes, and concurrent operations may take place on each plane. However, it is understood that an SSD may comprise any number of planes. As further illustrated in FIG. 2, each plane 204 may comprise a number of blocks 206. A block may be the smallest unit of the SSD that can be erased. Blocks may also be referred to herein as "erase blocks." Finally, as shown in FIG. 2, each block 206 may comprise a number of pages 208. A page may be the smallest unit of the SSD that can be programmed.

Program operations on the SSD, also known as "writes" or "write operations," may be made to any given page on the SSD. A page may be, for example, about 4-16 KB in size, although it is understood that any size may be used. In contrast, erase operations may be only be made at the block level. A block may be, for example, about 4-8 MB in size, although it is understood that any size may be used. A controller associated with the SSD may manage the flash memory and interface with the host system using a logical-to-physical mapping system, for example, logical block addressing (LBA).

SSDs generally do not allow for data stored in a given page to be updated. When new or updated data is saved to the SSD, the controller may be configured to write the new or updated data in a new location on the SSD and to update the logical mapping to point to the new physical location. This new location may be, for example, a different page within the same erase block, as further illustrated in FIG. 3. At this point, the data in the old location may no longer be valid, and may need to be erased before the location can be written to again.

However, as discussed above, the old or invalid data may not be erased without erasing all of the data within the same erase block. For example, that erase block may contain the new or updated data, as well as other data that a user may wish to keep stored on the SSD. In order to address this issue, the controller may be configured to copy or re-write all of the data that is not intended to be deleted to new pages in a different erase block. This may be referred to herein as "garbage collection." The new or updated data may be written directly to a new page or may be striped across a number of pages in the new erase block. This undesirable process by which data is written to the SSD multiple times as a result of the SSDs inability to update data is known as write amplification, and is further illustrated below in connection with FIG. 3. Write amplification presents a significant problem in SSD storage as SSDs can only be programmed and erased a limited number of times. This may be referred to herein as the number of program/erase cycles that the SSD can sustain.

Figure 3A:
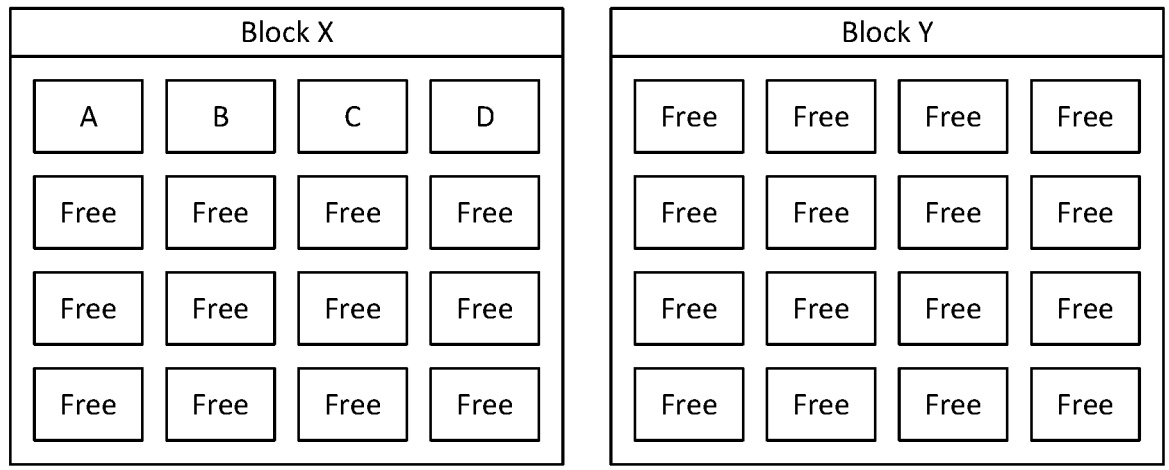
FIGS. 3A-3D illustrate a process of garbage collection performed on the SSD.

As shown in FIG. 3A, an SSD may comprise two blocks: Block X and Block Y. It is understood that while the SSD illustrated in FIGS. 3A-3D comprises two blocks, an SSD may comprise any number of blocks. As discussed above, a block or "erase block" may comprise the smallest unit of the SSD that may be erased. Each of Block X and Block Y illustrated in FIGS. 3A-3D comprises sixteen pages, however, it is understood that a given block may comprise any number of pages. Data may be written directly to any one of the pages on Block X or Block Y. In addition, data may be striped across a plurality of pages associated with Block X or Block Y. As shown in FIG. 3A, data may be written to Page A, Page B, Page C and Page D associated with Block X, while the remaining pages of Block X may be left empty (free). Block Y may similarly be left empty.

Figure 3B:
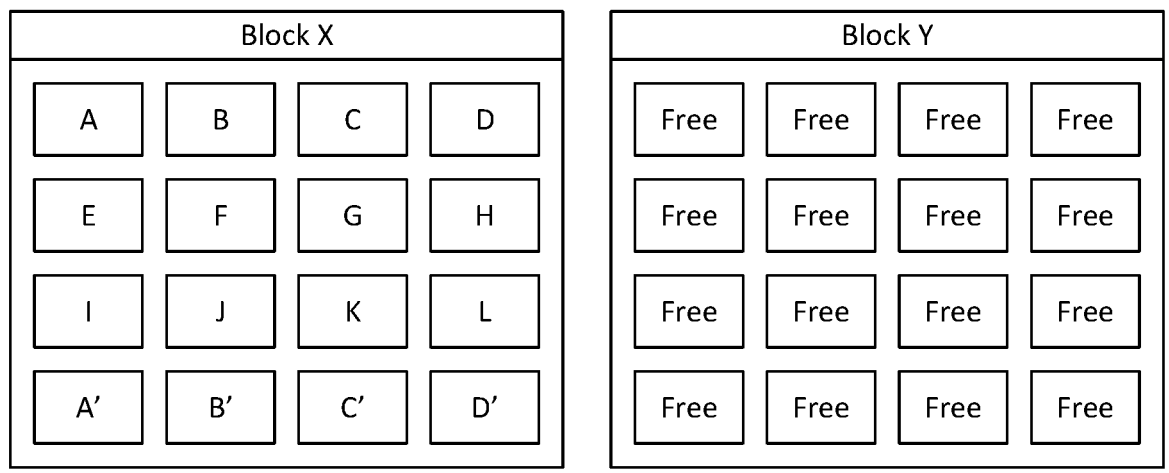

As shown in FIG. 3B, additional data may be written to Block X at a later time via a write operation by the controller. Again, this write operation may comprise writing data directly to any one of the pages in Block X or Block Y or striping the data across a plurality of the pages. For example, data may be written directly to or striped across Page E, Page F, Page G, Page H, Page I, Page J, Page K and Page L associated with Block X. In addition, a user or application may wish to update the information stored at Pages A-D of FIG. 3A. However, as discussed above, the SSD may not allow for data to be updated. Thus, in order to store the new data, a controller associated with the SSD may be configured to execute a write operation to additional pages in Block X representing the updates to Pages A-D. These pages, as illustrated in FIG. 3B, may be labeled as Page A', Page B', Page C' and Page D'. The data stored at Pages A'-D' may represent any of minor or major updates to the data stored at Pages A-D.

Figure 3C:
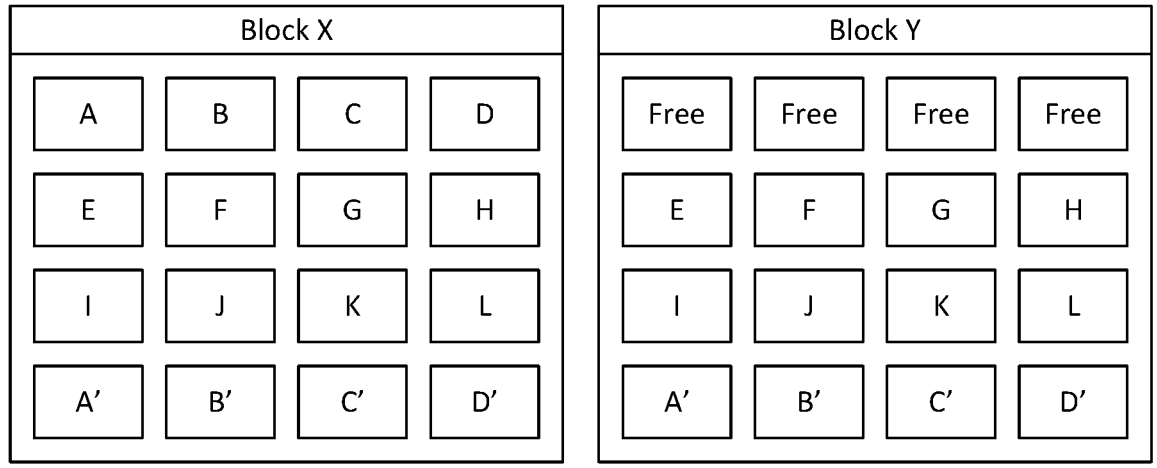

As further illustrated in FIG. 3C, in order to perform a delete operation on the data stored at Pages A-D, and as further discussed above, the entirety of Block X may need to be erased. The controller associated with the SSD may be configured to copy or re-write important data on Block X that the user does not wish to be deleted to a different erase block, for example, Block Y. As illustrated in FIG. 3C, the controller may be configured to copy the data stored at Pages E-L as well as the data stored at Pages A'-D' of Block X to Block Y.

As discussed above, this process of "updating" data to a new location may be referred to "garbage collection." The process of garbage collection as illustrated in FIG. 3C may address the issue of erasing unwanted data while keeping important data stored on the device. However, this comes at the cost of copying and re-writing a single piece of data multiple times on the same SSD. For example, both Block X and Block Y of the SSD may contain copies of the data stored at Pages E-L as well as the data stored at Pages A'-D'. This undesirable process of re-writing multiple copies of the same data may be known as write amplification.

Figure 3D:
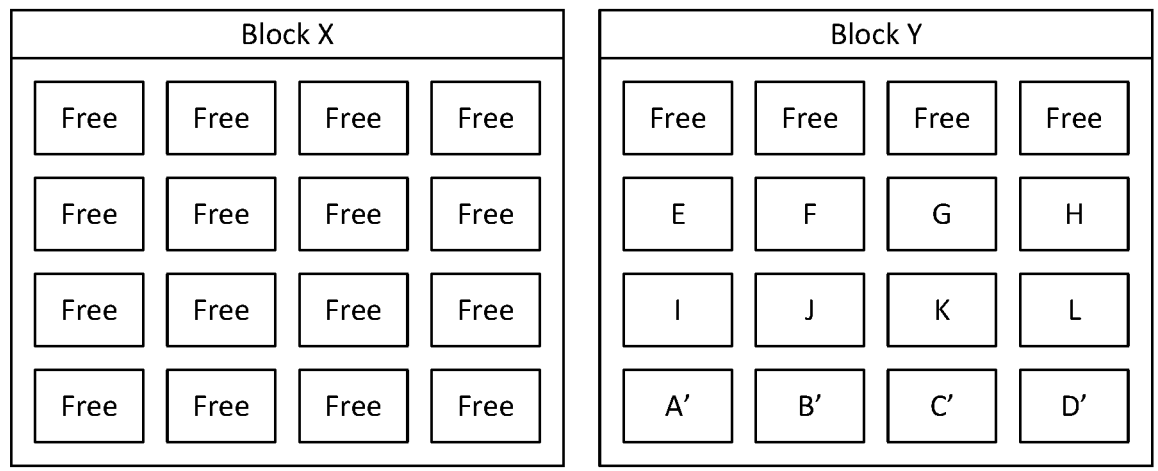

Finally, as shown in FIG. 3D, the controller may be configured to erase all of the data stored at Block X. As all of the important data intended to be kept on the SSD has been copied to Block Y, the entirety of Block X may be deleted by the controller. Once this process has completed, the controller may be configured to write new data to any of the pages in Block X. However, as discussed above, this process of write amplification presents a significant problem in SSD storage as an SSD may only be programmed and erased a limited number of times. For example, in the case of a single level flash, the SSD may be written to and erased a maximum of 50,000-100,000 times.

One additional feature associated with SSD storage is the over-provisioning of storage space. Over-provisioning may be represented as the difference between the physical capacity of the flash memory and the logical capacity presented through the operating system as available for the user. During, for example, the process of garbage collection, the additional space from over-provisioning may help lower the write amplification when the controller writes to the flash memory. The controller may use this additional space to keep track of non-operating system data such as, for example, block status flags. Over-provisioning may provide reduced write amplification, increased endurance and increased performance of the SSD. However, this comes at the cost of less space being available to the user of the SSD for storage operations.

Solid state devices may support functionality known as "streaming" by which data may be associated with a particular stream based, for example, on an estimated deletion time of the data, in order to reduce the problems associated with write amplification and over-provisioning. A stream, as discussed herein, may comprise one or more erase blocks. The process of streaming SSDs may comprise, for example, instructing the SSD to associate a bunch of data together in the same erase block or group of erase blocks (i.e., in the same "stream") because it is likely that all of the data will be erased at the same time. Because data that will be deleted together will be written to or striped across pages in the same erase block or group of erase blocks, the problems associated with write amplification and over-provisioning can be reduced. The process of streaming SSDs may be further illustrated as shown in connection with FIG. 4.

Figure 4:
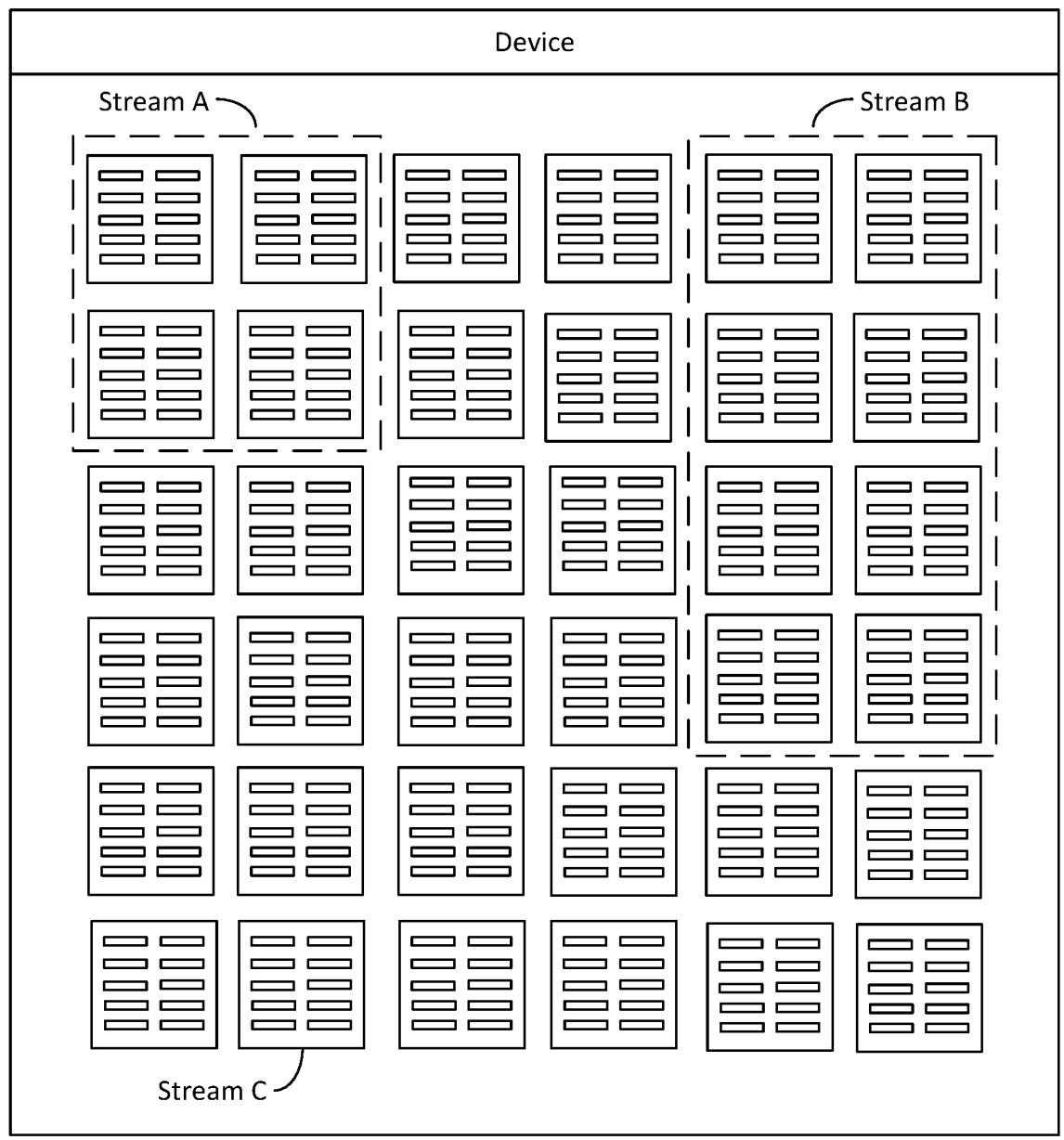
FIG. 4 illustrates a process of streaming multiple erase blocks on a device, for example, on an SSD.

As shown in the example of FIG. 4, data may be grouped together in one or more erase blocks based, for example, on an estimated erase time of the data stored at each of the erase blocks. The controller may organize the one or more erase blocks such that data in each of the erase blocks may be erased together. This organization of data into one or more erase blocks based, for example, on an estimated deletion time of the data in the one or more erase blocks, may be referred to herein as "streaming." As shown in FIG. 4, four erase blocks may be associated with Stream A, eight erase blocks may be associated with Stream B, and a single erase block may be associated with Stream C. The controller may be configured, for example, to perform all write operations of data that may be erased within two months to Stream A, all write operations of data that may be erased within two weeks to Stream B, and all write operations of data that may be erased within two days to Stream C. In another example, the controller may be configured to perform write operations to Stream A that may be erased upon the occurrence of an event that would result in all of the data written to Stream A being "updated" and subsequently marked as invalid.

A file system and a storage driver associated with a computing device may be provided with awareness of the "streaming" capability of an SSD in order to enable the file system and/or an application to take advantage of the streaming capability for more efficient storage. For example, a file system may be configured to receive a first request from an application to associate a file with a particular stream identifier available on a storage device, intercept one or more subsequent requests to write data to the file, associate the one or more subsequent requests with the stream identifier, and instruct a storage driver associated with the storage device to write the requested data to the identified stream. The file system may be further configured to store metadata associated with the file, the metadata comprising the stream identifier associated with the file. In addition, the file system may be configured to send to the application a plurality of stream parameters associated with the stream. The file system may be further configured, prior to associating the file with the stream identifier, to validate the stream identifier.

Figure 5:
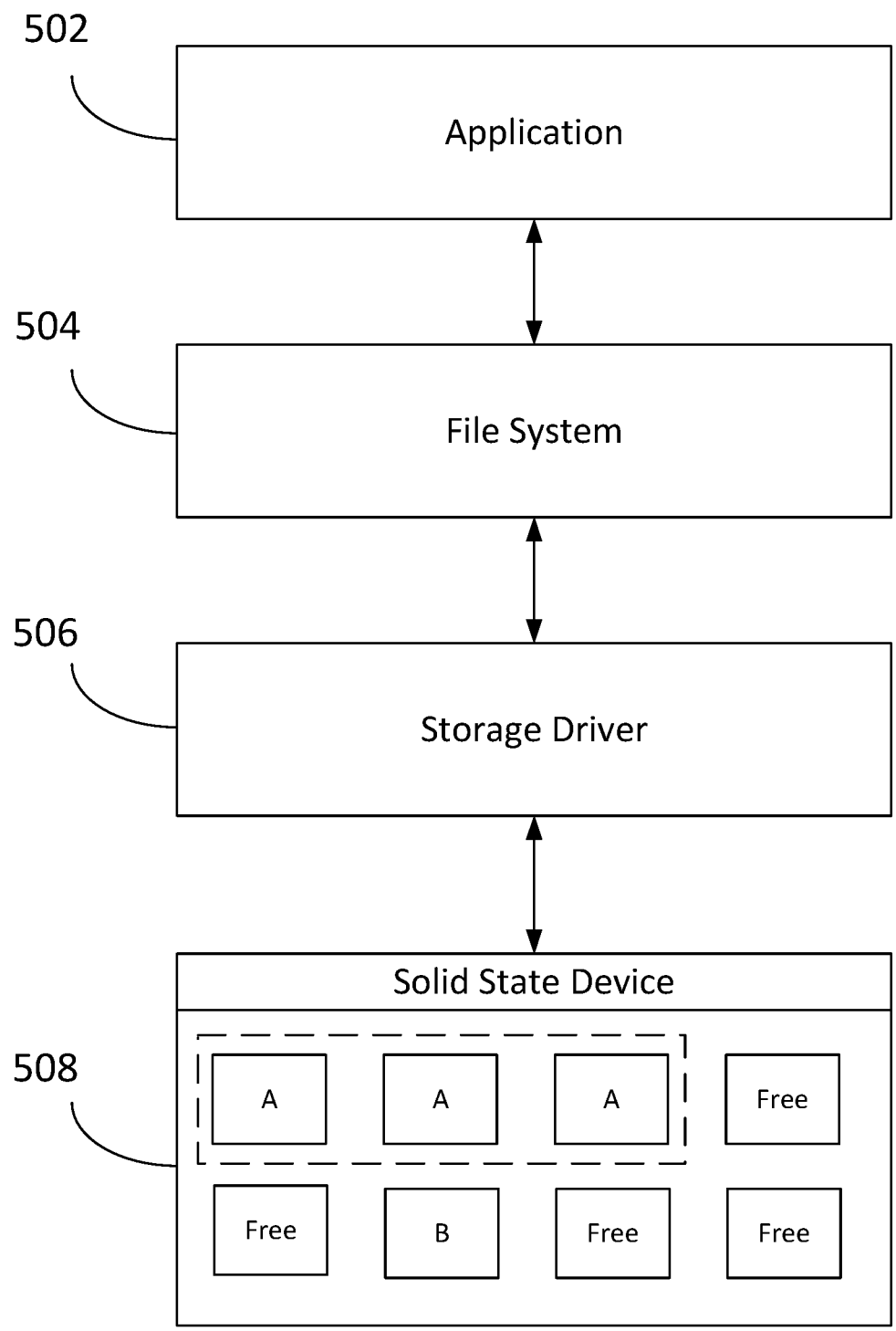
FIG. 5 illustrates an example architecture for implementing streaming functionality on a device.

FIG. 5 is a block diagram illustrating example components of an architecture for implementing the streaming SSD functionality disclosed herein. As shown, in one embodiment, the architecture may comprise an application 502, a file system 504, a storage driver 506, and a storage device 508.

The application 502 may be configured to read and write files to the device 508 by communicating with the file system 504, and the file system 504 may, in turn, communicate with the storage driver 506. In order to take advantage of writing to a stream on the SSD, the application 502 may instruct the file system which ID to associate with a given file. The application 502 may be configured to instruct the file system which ID goes with the given file based, for example, on a determination that all of the data of the file may be deleted at the same time. In one embodiment, multiple erase blocks may be tagged with a particular stream ID. For example, using the device illustrated in FIG. 5, multiple erase blocks may be associated with Stream A, and data may be written directly to a given one of the erase blocks or striped across multiple pages associated with the erase blocks in Stream A. As another example, Stream B may comprise a single erase block, and data may be written to a given one of the pages or striped across multiple pages associated with the erase block associated with Stream B. The data associated with Stream A may have a different estimated deletion time than the data associated with Stream B.

The file system 504 may be configured to expose an application programming interface (API) to the application 502. For example, the application 502, via an API provided by the file system 504, may be configured to tag a file with a particular stream ID. In addition, the application 502, via an API provided by the file system 504, may be configured to perform stream management, such as, for example, determining how many streams can be written to simultaneously, what stream IDs are available, and the ability to close a given stream. Further, the application 502, via an API provided by the file system 504, may be configured to determine a number of parameters associated with the stream such as, for example, the optimal write size associated with the stream.

The file system 504 may be further configured to intercept a write operation by the application 502 to a file in the device 508, determine that the file is associated with a particular stream ID, and to tag the write operation (i.e., I/O call) with the stream ID. The file system 504 may be further configured to store metadata associated with each file of the device 508, and to further store the particular stream ID associated with each file along with the file metadata.

The storage driver 506 may be configured to expose an API to the file system 504. For example, the file system 504, via an API provided by the storage driver 506, may be configured to enable stream functionality on the storage device 508. The file system 504, via an API provided by the storage driver 506, may be further configured to discover existing streams on the device 508. The file system 504, via an API provided by the storage driver 506, may be further configured to obtain information from the device such as, for example, the ability of the device to support streams and what streams, if any, are currently open on the device. The storage driver 506 may be configured to communicate with the device 508 and to expose protocol device agnostic interfaces to the file system 504 so that the storage driver 506 may communicate with the device 508 without the file system 504 knowing the details of the particular device.

The device 508 may comprise, for example, an SSD. The SSD illustrated in FIG. 5, for example, comprises eight erase blocks. Data may be written individually to a given erase block or may be striped across a plurality of the erase blocks in order to maximize throughput on the SSD. As also shown in 508, and as further discussed herein, the plurality of erase blocks may be organized into streams such that data can be erased in a more efficient manner, as described above. For example, the SSD illustrated in FIG. 5 comprises Stream A which is associated with three erase blocks and Stream B which is associated with a single erase block.

As discussed herein, streaming is a process by which data stored on an SSD may be grouped together in a stream comprising one or more erase blocks based, for example, on an estimated deletion time of all of the data in the stream. By storing data that is likely to be deleted together in the same erase block or group of erase blocks, numerous problems associated with SSD storage can be alleviated. However, the number of streams available on a given SSD may be limited. In some cases, the size of a given stream may be much larger than the amount data stored for a particular file, and assigning that to an individual stream may result in inefficient use of the streaming functionality offered by the SSD. Thus, it may be desirable to perform a combination of stream and non-stream writes for data associated with particular files based, for example, on the amount of data stored for the particular file and a size of each available stream block.

Figure 6:
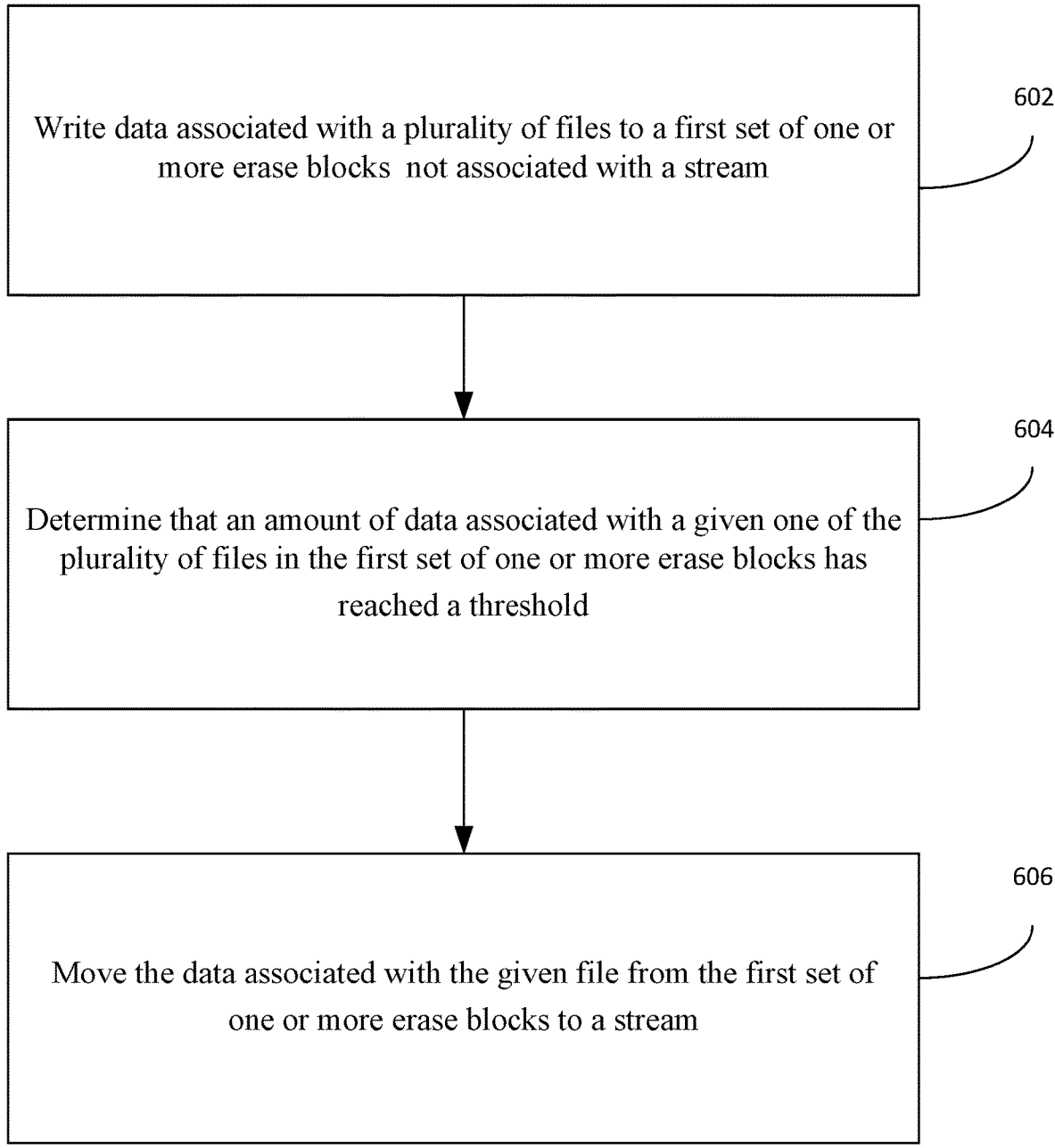
FIG. 6 illustrates an example method for optimizing the use of available streams on a storage device.

An example method for optimizing the use of streams available on a storage device is illustrated in FIG. 6. For example, the method may comprise writing data associated with a plurality of files to a first set of one or more erase blocks not associated with a stream, determining that an amount of data associated with a given one of the plurality of files in the first set of one or more erase blocks has reached a threshold, and moving the data associated with the given file from the first set of one or more erase blocks to a stream, the stream comprising a second set of one or more erase blocks different from the first set of one or more erase blocks. The first set of one or more erase blocks and the second set of one or more erase blocks may be located on a storage device, such as SSD 508 illustrated in FIG. 5. FIGS. 7-11, discussed below, illustrate in further detail the process of using both stream and non-stream writes to optimize the use of available streams. It is understood that the steps illustrated in FIGS. 7-11 may be performed by any number of devices, including, for example, a file system associated with a computing device or the SSD comprising the one or more streams.

Figure 7:
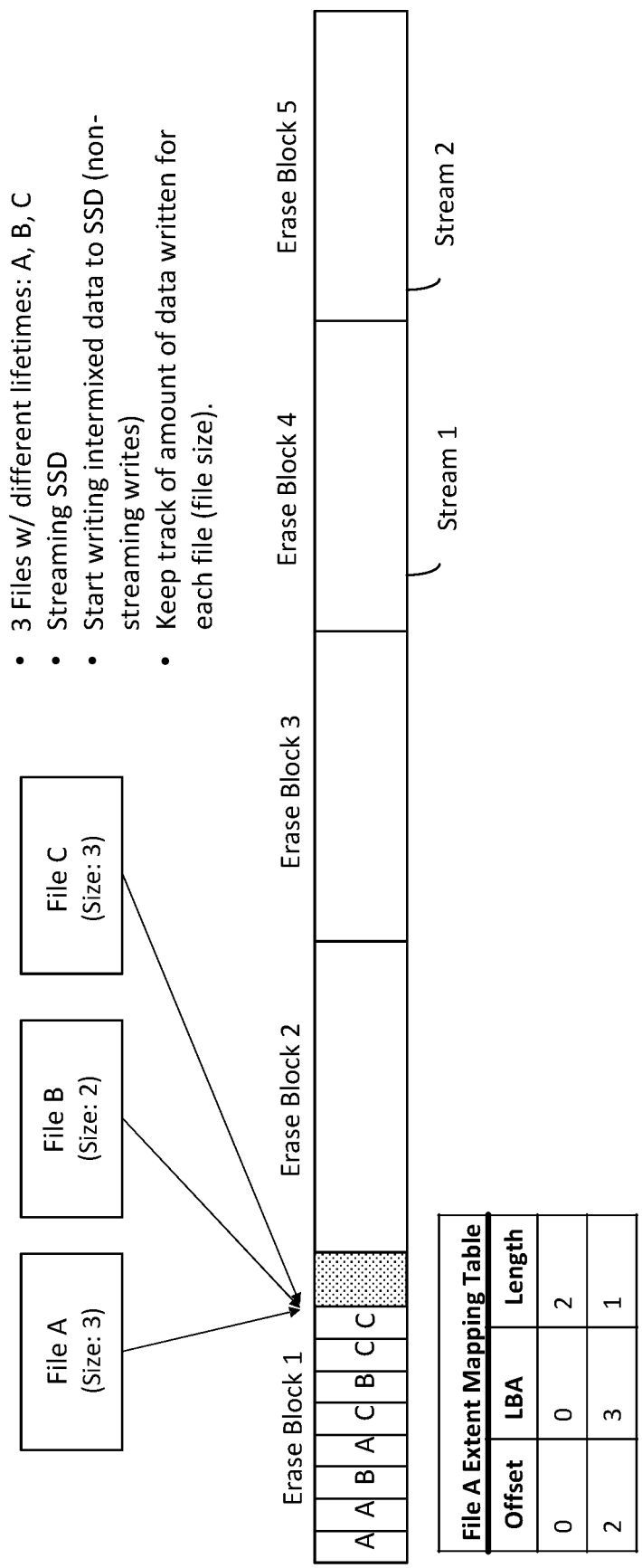
FIG. 7 illustrates a method of writing data associated with a number of files to an erase block in a non-stream manner.

FIG. 7 illustrates a method of writing data associated with a plurality of files to a first set of one or more erase blocks on a storage device. As shown in FIG. 7, data associated with File A, File B and File C may be written to the first set of one or more erase blocks. The first set of one or more erase blocks may not be associated with a stream. A set of one or more erase blocks may comprise any number of erase blocks available on the storage device. In one example, the first set of one or more erase blocks may comprise all erase blocks on the storage device that are not associated with a stream. In another example, the first set of one or more erase blocks may comprise a subset of all erase blocks on the storage device that are not associated with a stream. In another example, the set of one or more erase blocks may comprise a single erase block. In another example, the first set of one or more erase blocks may comprise one or more erase blocks in a stream. As shown in the example of FIG. 7, data associated with File A, File B and File C may be written to erase block 1. The set of one or more erase blocks may also comprise erase block 2 and erase block 3. As also shown in the example of FIG. 7, erase block 4 may be associated with Stream 1 and erase block 5 may be associated with Stream 2. However, as discussed herein, a stream may comprise any number of erase blocks. Data from each of File A, File B and File C may be written to any of erase blocks 1, 2 or 3 as part of a non-stream write. Thus, it is understood that data from each of File A, File B and File C may have a different estimated erase time. For example, it may be estimated that data associated with File A may be deleted two weeks from the time of the write operation, data associated with File B may be deleted two months from the time of the write operation and data associated with File C may be deleted two years from the time of the write operation.

As further shown in FIG. 7, a file system may be configured to keep track of the amount of data written for each file. For example, the file system may be configured to store metadata associated with each of the files. In one embodiment, the file system may be configured to maintain metadata about a file and its location on the storage device. For example, the metadata may take the form of a file extent mapping table, defining the offset, logical block address (LBA) and length of all data associated with a given file, as discussed further below.

Figure 8:
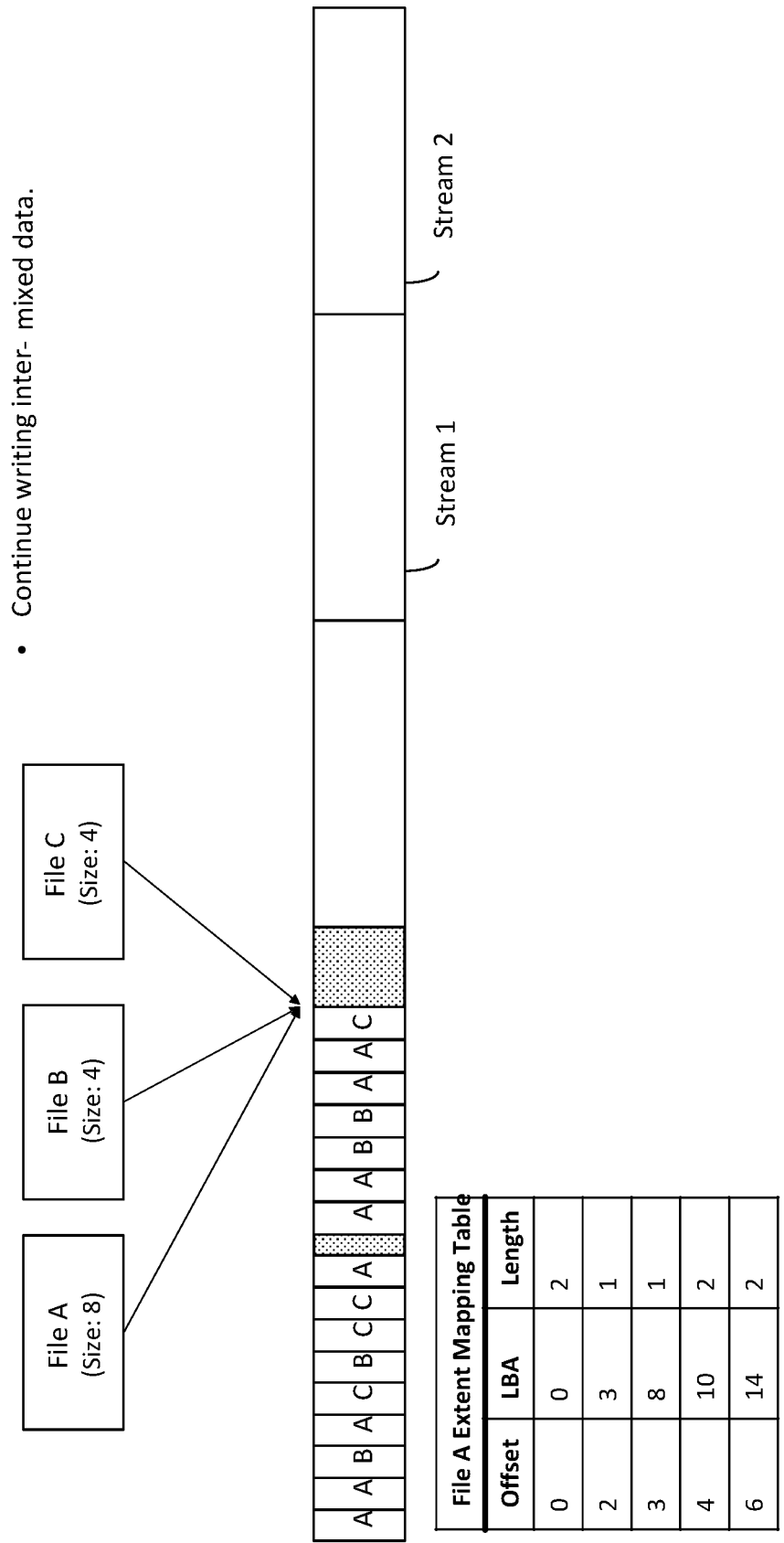
FIG. 8 illustrates the continued writing data associated with a number of files to a second erase block in a non-stream manner.

As shown in FIG. 8, data associated with each of File A, File B and File C may be continuously written to the first set of one or more erase blocks. In one embodiment, as erase block 1 reaches capacity, data associated with each of the files may be written to erase block 2. As data is continuously written for each of the files, it may be determined that an amount of data associated with a given one of the plurality of files in the first set of one or more erase blocks has reached a threshold. The threshold may be based on a storage capacity of one of more of the streams on the storage device. For example, a given stream may be able to store 256 MB of data. However, it is understood that the threshold may be based on any number of factors. For example, it could be possible that the application or some other entity residing on the computing device sends to the file system an indication that the file will soon be expanding in size and it would make sense to begin writing to a stream. In addition, metadata associated with the stream may define a threshold of, for example, 200 MB. The threshold may define the minimum amount of data that can be moved to the stream. Thus, when an amount of data associated with a given file in the first set of one or more erase blocks reaches 200 MB, data associated with the given file may be moved to a stream. It is understood that a stream may be of any size and that the threshold may be based on any number of metrics. It is further understood that a storage device may comprise multiple streams having different lengths, and that each of these streams may be associated with a different threshold.

Figure 9:
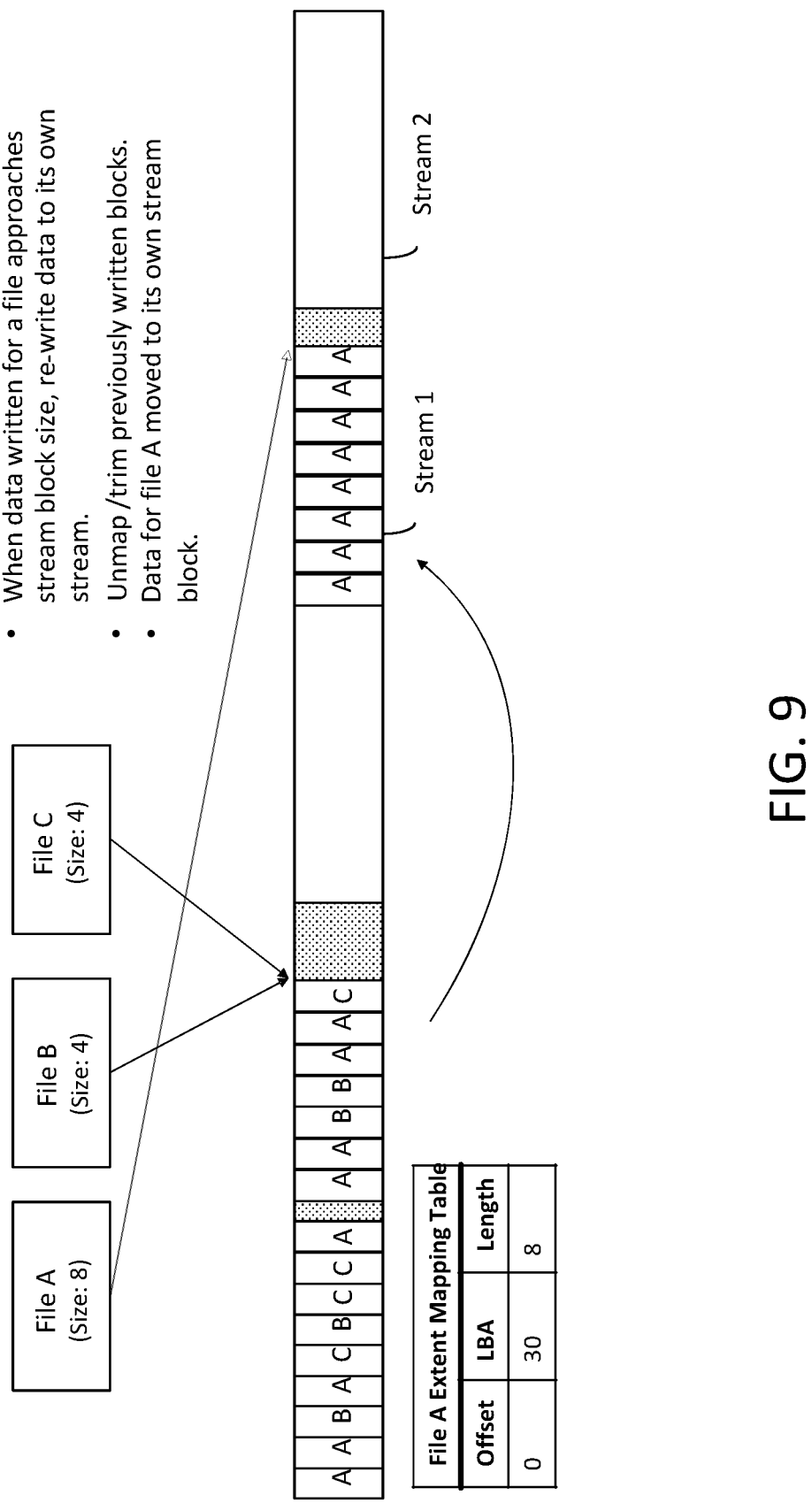
FIG. 9 illustrates a method of moving the data associated with a given file from a group of one or more erase blocks to a stream.

As shown in FIG. 9, once this threshold is reached, data associated with the given file may be moved from the first set of one or more erase blocks to a stream. The stream may comprise a second set of one or more erase blocks different from the first set of one or more erase blocks. As discussed herein, the stream may be used exclusively to store data of the given file. For example, as shown in FIG. 9, all of the data associated with File A in the first set of one or more erase blocks may be moved to Stream 1, Stream 1 being used exclusively to store data of File A. In the example that the first set of more erase are associated with a first stream, data may be moved from the first set of one or more erase blocks associated with the first stream to one or more erase blocks associated with a second stream, the first stream comprising data associated with a plurality of files and the second stream comprising data associated only with the given file. As also shown in FIG. 9, a trim operation may be performed on the data associated with the given file in the first set of one or more erase blocks. For example, a file system may be configured to instruct a storage device to execute a trim command on the data, thereby informing the storage device that the data inside the first set of one or more erase blocks is no longer in use and may be deleted. In response to receipt of the trim command, the storage device may be configured to "delete" the data associated with the given file in the first set of one or more erase blocks. As discussed herein, the storage device may need to perform garbage collection before the data can be permanently deleted.

Figure 10:
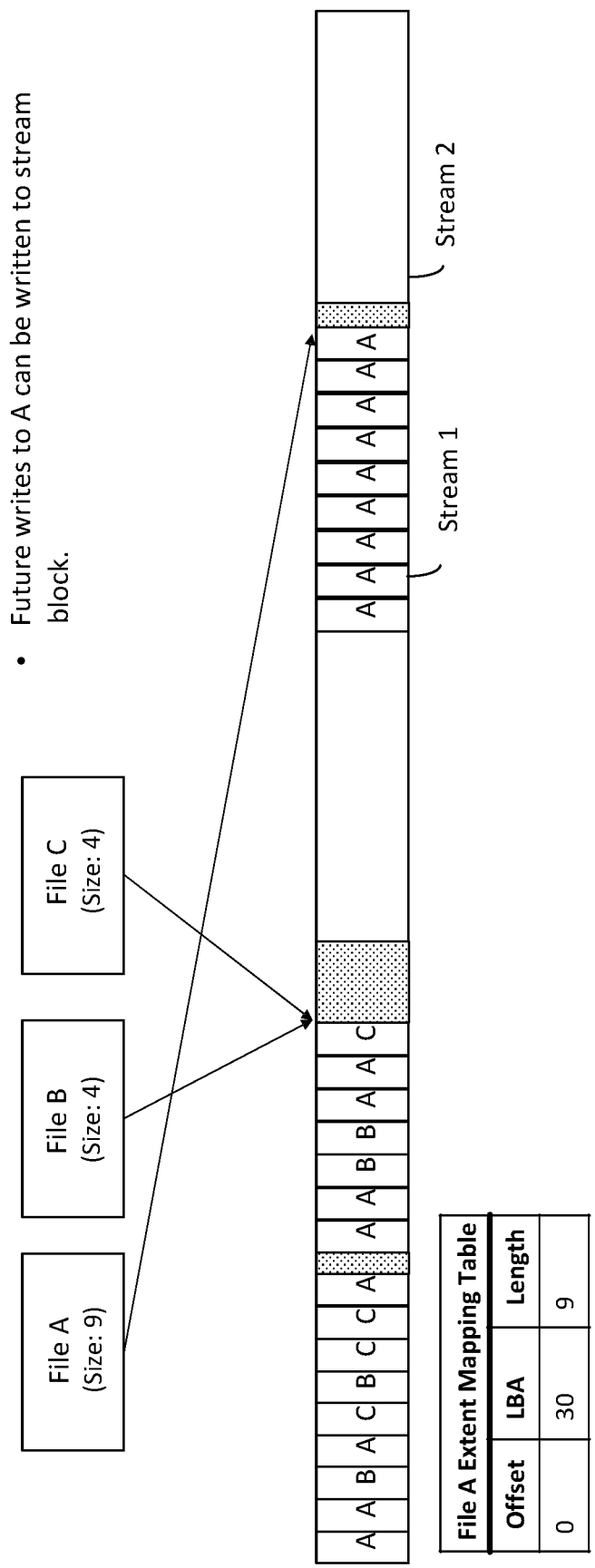
FIG. 10 illustrates a method of writing additional data associated with the given file to the stream.

As shown in FIG. 10, data associated with the given file may be written to the stream. For example, data associated with File A may be continued to be written to Stream 2 until the amount of data in the stream has reached a second threshold, as discussed further below. A size of the stream may be stored as metadata. As shown in the example of FIG. 10, an additional write operation for File A has been made to Stream 1. As further shown in the example of FIG. 10, the amount of data in Stream 1 associated with File A may be approaching the capacity of the stream.

Figure 11:
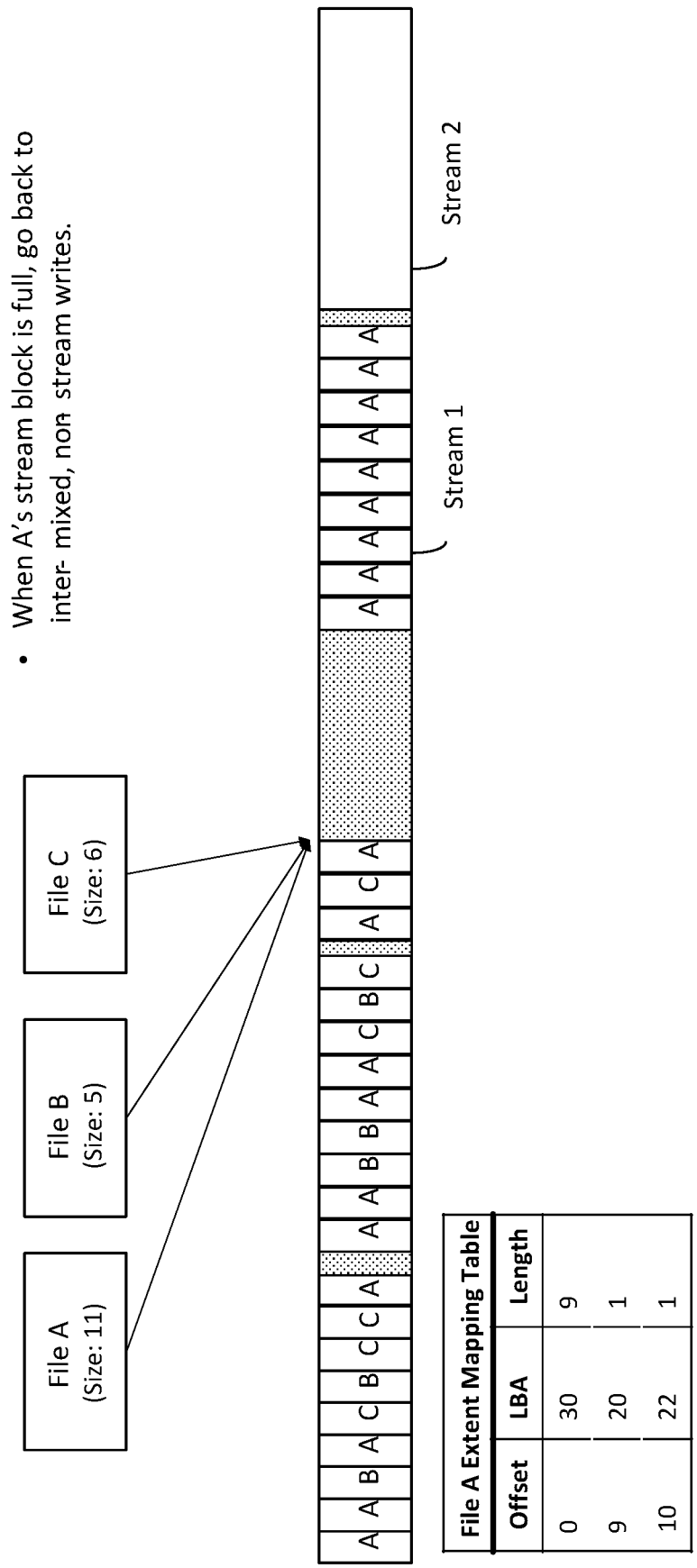
FIG. 11 illustrates a method of writing data associated with the given file in a non-stream manner in response to a determination that the stream is full.

As shown in FIG. 11, in response to determining that the amount of data in the stream has reached a second threshold, the second threshold being based on a size of the stream, further data associated with the given file may again be written to the first set of one or more erase blocks. As shown in FIG. 11, the first set of one or more erase blocks may further comprise erase block 3 on the SSD. Erase block 3 may comprise, for example, data associated with File A and File C. However, it is understood that data may be written to any of the erase blocks on the storage device. For example, data associated with File A may be written to erase block 3 as well as any other available erase block on the SSD not associated with a stream. If at any point, data associated with a given one of the files has reached a predetermined threshold associated with an available stream on the storage device, the data may be moved to the stream comprising data exclusive to that file, as discussed herein.

In one example, the steps illustrated in FIGS. 7-11 may be performed by a file system associated with a computing device. This method may be referred to herein as a "host managed" method. This example method, discussed further below, may comprise moving the data associated with the given file from the first set of one or more erase blocks to local memory, and then sending, to the storage device, a request to write the data associated with the given file from the local memory to a stream on the storage device. The file system may then update metadata that it maintains for the file to reflect the change in location of the data on the storage device. In another example, the steps illustrated in FIGS. 7-11 may be performed by the storage device comprising the one or more streams. This method may be referred to herein as a "device managed" method. From the perspective of the storage device, this example method, discussed further below, may comprise receiving a stream identifier associated with the stream and a request to move the data associated with the given file from the first set of one or more erase blocks to the stream, copying the data associated with the given file from the first set of one or more erase blocks to the stream, and updating metadata maintained by the storage device to reflect the change in location of the data on the storage device.

Figure 12:
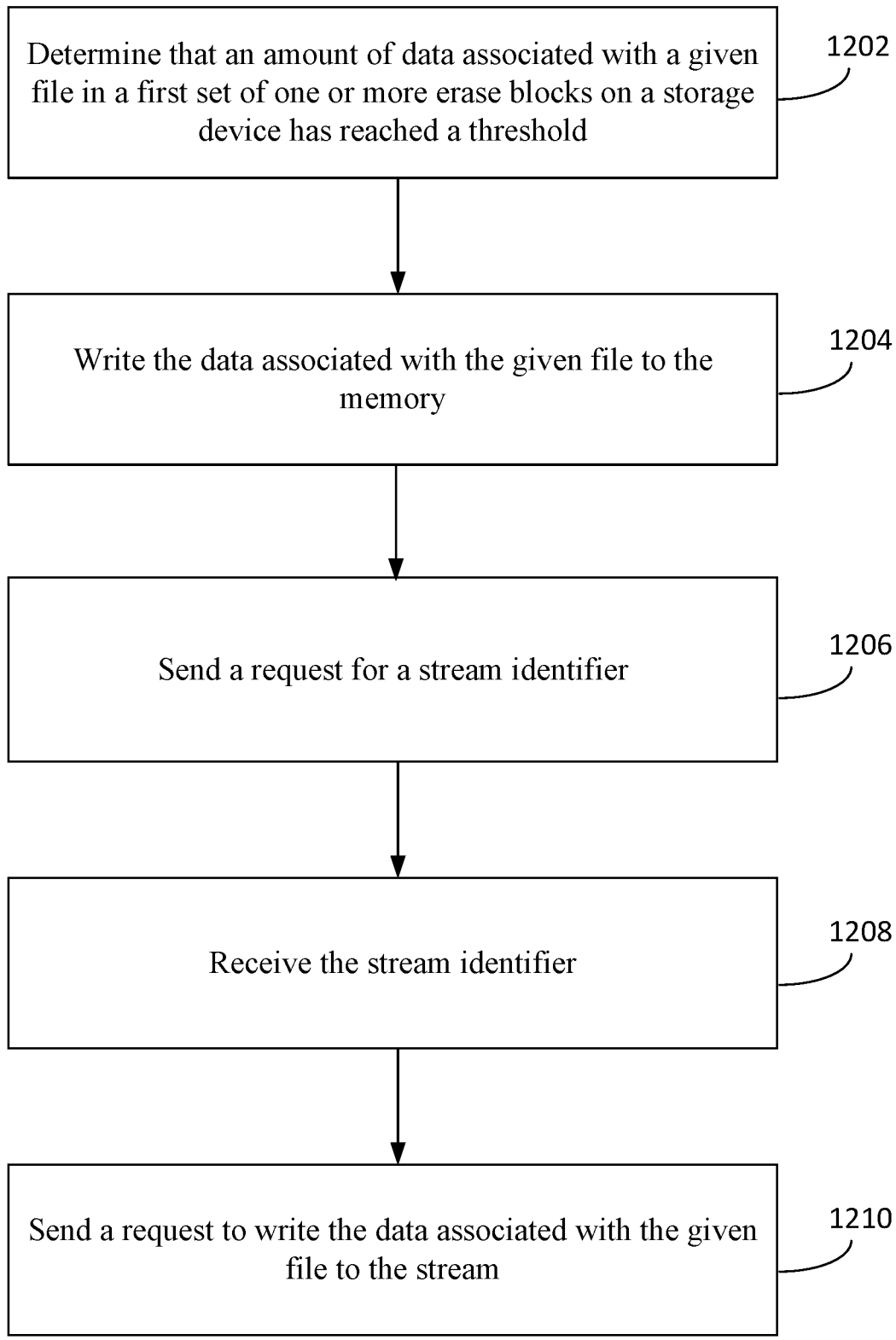
FIG. 12 illustrates a file system implementing the method for optimizing the use of available streams on the storage device.

FIG. 12 illustrates an example method implemented by a file system to optimize the use of available streams on a storage device. This method may be referred to as "host managed." As shown at step 1202 of FIG. 12, a file system may be configured to determine that an amount of data associated with a given file in a first set of one or more erase blocks has reached a threshold, the first set of one or more erase blocks comprising data associated with a plurality of files. The file system may be, for example, file system 504 illustrated in FIG. 5. The storage device may be, for example, the SSD 508 illustrated in FIG. 5. As discussed above in connection with FIGS. 7-11, data associated with a plurality of files may be written to the first set of one or more erase blocks. The first set of one or more erase blocks may correspond, for example, to a first erase block and a second erase block. The threshold may be based on a storage capacity of the one or more available streams on the storage device. For example, the file system 504 may determine that when data associated with the given file in the first set of one or more erase blocks reaches half of the maximum storage capacity of a given stream, to move the data associated with that file to the available stream. As discussed further below, the size of the stream may be stored as metadata.

As shown at step 1204 of FIG. 12, the file system 504 may be configured to write the data associated with the given file to memory. The memory may be, for example, system memory 116 associated with computing device 112 illustrated in FIG. 1.

As shown at step 1206 of FIG. 12, the file system 504 may be configured to send, to the storage device 508, a request for a stream identifier, the stream identifier being associated with a stream. The stream may comprise a second set of one or more erase blocks different from the first set of one or more erase blocks. For example, as illustrated in FIG. 9, the stream may comprise a single erase block, such as erase block 4. However, it is understood that a stream any comprise any number of erase blocks on the storage device 508.

As shown at step 1208 of FIG. 12, the file system 504 may receive, from the storage device 508, the stream identifier. The storage device 508 may be configured to determine an available stream based, for example, on the amount of data associated with the file to be stored in the stream, and to send to the file system 504 the stream identifier associated with that stream. Receiving the stream identifier from the storage device 508 may grant exclusive access to the stream by File A.

As shown at step 1210 of FIG. 12, the file system 504 may send, to the storage device 508, a request to write the data associated with the given file from the local memory to the stream. As shown at FIG. 9, the stream may comprise data exclusive to the given file. Sending the request to write the data associated with the given file to the stream may comprise sending, to the storage device 508, the stream identifier associated with the stream. Sending the stream identifier may instruct the storage device 508 where to write the data associated with the given file.

As further shown in FIG. 9, the file system 504 may be further configured to instruct the storage device 508 to execute a trim command on the data associated with the given file in the first set of one or more erase blocks. The trim command may inform the storage device 508 that the data inside the first set of one or more erase blocks is no longer in use and may be deleted. In response to receipt of the trim command, the storage device 508 may be configured to delete the data associated with the given file in the first set of one or more erase blocks. As discussed above, the storage device 508 may need to perform garbage collection before the data can be permanently deleted.

As discussed above, the file system 504 may maintain metadata for each file that keeps track of the location(s) of the data associated with the given file on the storage medium. This metadata may take the form of, for example, a file extent table, as shown in FIGS. 7-11. The file extent table may define, for example, an offset, a logical block address (LBA), and a length of each data range of a given file stored on the storage device. In the example of FIG. 7, the file extent table comprises data for File A. However, it is understood that the file extent table may comprise data for any number of files. Each data entry for a given file in the erase block may correspond to a page of data, such as one of pages 208 illustrated in FIG. 2. As discussed above in connection with FIG. 2, a page may be the smallest unit of the SSD 508 that can be programmed. As shown in the table of FIG. 7, two pages of data may be written to erase block 1, the pages beginning at LBA 0 and having an offset of 2. An offset may refer to the number of pages of data associated with the given file at the time of the write operation, while the length may refer to the number of consecutive pages associated with the file. As further shown in FIG. 7, a third page of data associated with File A may be written to erase block 1, the third page of data beginning at LBA 3 with an offset of 2. As shown in FIG. 8, additional write operations may be performed to the first set of one or more erase blocks. For example, a single page of data associated with File A may begin at LBA 8, two pages of data associated with File A may begin at LBA 10, and two pages of data associated with File A may begin at LBA 14.

As discussed herein, when the file system 504 determines that a threshold amount of data associated with a given file has been met, the file system may move the data from the first set of one or more erase blocks to a stream. Once the write operation is completed, the file system may update the metadata it stores for the file to reflect the change in location of the data of file A. For example, in an embodiment in which the file metadata takes the form of one or more entries in a file extents table that map byte offsets of ranges of data of the file to logical block addresses (LBA) associated with the locations of those ranges on the storage device, the LBAs for the file may be updated to reflect the new location of the data in the stream on the storage device. For example, as shown in FIG. 9, each of the pages of data associated with File A has been moved to Stream 1. Thus, the file extent table may be updated to reflect the new LBA for the ranges of data associated with File A in Stream 1. Because the ranges of data have been moved to consecutive logical addresses on the storage device in Stream 1, a single entry suffices to indicate that the data, having a length of "8" now resides starting at LBA "30" of the storage device.

As shown in FIG. 10, as additional write operations are made to File A, the file extent table may be updated to include the additional pages of data. For example, as one page of data is added to Stream 1, the file extent table may be updated to include information about the location of that additional page of data associated with File A. As shown in FIG. 11, as the threshold of Stream 1 has been reached and no new data can be written to the stream, data associated with File A may be written to another location on the storage device, such as, for example, the first set erase blocks not associated with a stream. Thus, the file extent table may be further updated to include those new entries. In the example of FIG. 11, two new pages of data associated with File A have been written to the first set of one or more erase blocks, a first page beginning at LBA 20 and a second page beginning at LBA 22.

Figure 13:
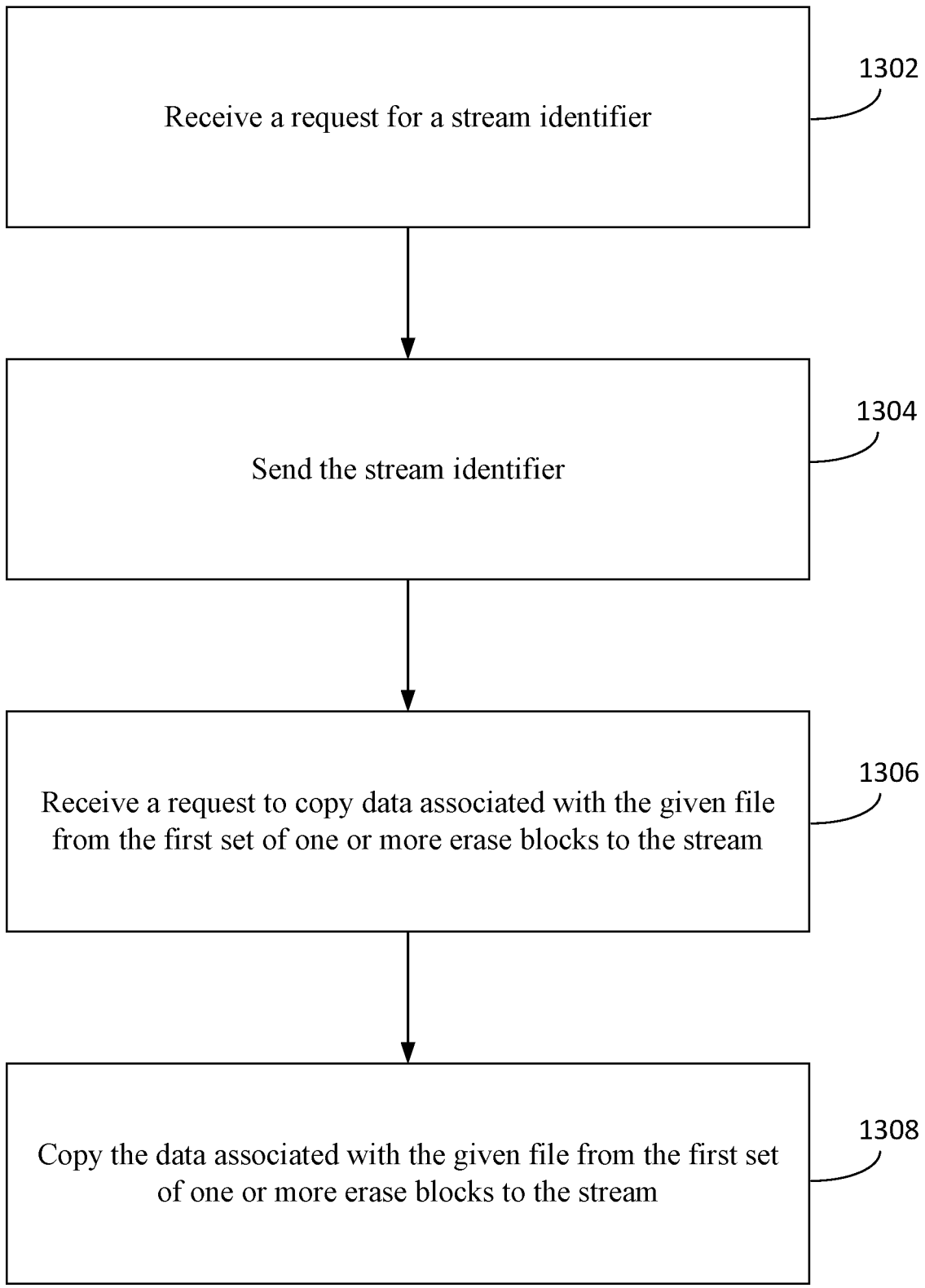
FIG. 13 illustrates a storage device implementing the method for optimizing the use of available streams on the storage device.

FIG. 13 illustrates a method performed by a storage device, such as SSD 508 illustrated in FIG. 5, to optimize the use of available streams on the storage device. This example may be referred to a "device managed." For example, as shown at step 1302 of FIG. 13, the storage device 508 may be configured to receive, from a file system, a request for a stream identifier, the file system being configured to send to the storage device the request for the stream identifier in response to a determination at the file system that data associated with a given file in a first set of one or more erase blocks on a storage device has reached a threshold, the first set of one or more erase blocks comprising data associated with a plurality of files. The file system may be, for example, file system 504 illustrated in FIG. 5. The file system 504 may make a determination that the data associated with a given file in a first set of one or more erase blocks has reached a threshold based on metadata stored in the file system. As one example, the metadata may comprise a size of the stream.

As shown at step 1304 of FIG. 13, the storage device 508 may send, to the file system 5-4, the stream identifier. The stream identifier may be associated with a stream comprising a second set of one or more erase blocks on the storage device 508 different from the first set of one or more erase blocks.

As shown at step 1306 of FIG. 13, the storage device 508 may receive, from the file system 5-4, a request to copy data associated with the given file from the first set of one or more erase blocks to the stream. The request may include the stream identifier associated with the stream. As shown in the example of FIG. 9, all data associated with File A may be moved from erase blocks 1 and 2 to Stream 1. Receiving a request to copy data associated with the given file from the first set of one or more erase blocks to the stream may comprise receiving, from the file system 504, a logical block address of the data associated with the given file. In one embodiment, the storage device 508 may further be configured to update metadata in the storage device 508 to include a location of the data associated with the given file in the stream. The location may comprise a physical block address of the data associated with the given file in the stream. For example, the storage device 508 may maintain a LBA to physical block mapping table, and upon receiving the LBAs of the data associated with the given file and copying the data associated with the given file from the first set of one or more erase blocks to the stream, may update the LBA to physical block mapping table to include a new physical block address(es) of the data associated with the given file. Having the storage device update its mapping of LBAs to physical blocks alleviates the need for the file system to update its own metadata (e.g., file extents table); hence the use of the term "device managed" to describe this embodiment.

As shown at step 1308, the storage device 508 may be configured to copy the data associated with the given file from the first set of one or more erase blocks to the stream. As shown in FIG. 9, the storage device 508 may be further configured to execute a trim command on the data associated with the given file in the first set of one or more erase blocks. As discussed above, there may be less overhead associated with the example method performed by the storage device, as the file system may not need to update its file location metadata (e.g., file extent mapping table). Instead, the storage device may update the physical addresses associated with each LBA range, while maintaining the same LBAs from the viewpoint of the file system.

As discussed above, a computing device may be configured to expose a number of stream identifiers which the host (e.g., a file system) can tag write operations with. This may also be referred to as "random access streaming." Using random access streaming, the device may determine how best to service the stream writes with the goals of reducing internal device write amplification, reducing read/write collisions, maximizing throughput, and minimizing latency. The device may be configured to create separate streams across separate NAND dies based on the data's lifetime such that data of the same lifetime and/or write characteristics would live and die together—thus freeing an entire erase unit at a time—and thereby reducing garbage collection.

In another embodiment, an append-only streams capability may be implemented that allows the host (e.g., the file system) to determine an optimal stream size based on the data to be stored in that stream. The storage device may expose to the host one or more characteristics of the available streams on the device, including but not limited to the maximum number of inactive and active streams on the device, the erase block size, the maximum number of erase blocks that can be written in parallel, and an optimal write size of the data. Using this information, the host can create particular streams on the device that is best suited for the data to be stored.

In one example, the file system may determine a number of erase blocks required for storing data on the device. The required number of erase blocks may be determined based on the data to be stored on the device and a size of the one or more erase blocks of the device. The file system may send to the device a request for a stream identifier associated with a stream that comprises one or more characteristics (e.g., an optimal number of erase blocks for storing the data) and may receive from the device a corresponding stream identifier. The file system may then write to the stream using the stream identifier. By placing the burden on the host to determine the stream characteristics based on the data to be stored, the processing burdens on the storage device may be significantly reduced.

Figure 14:
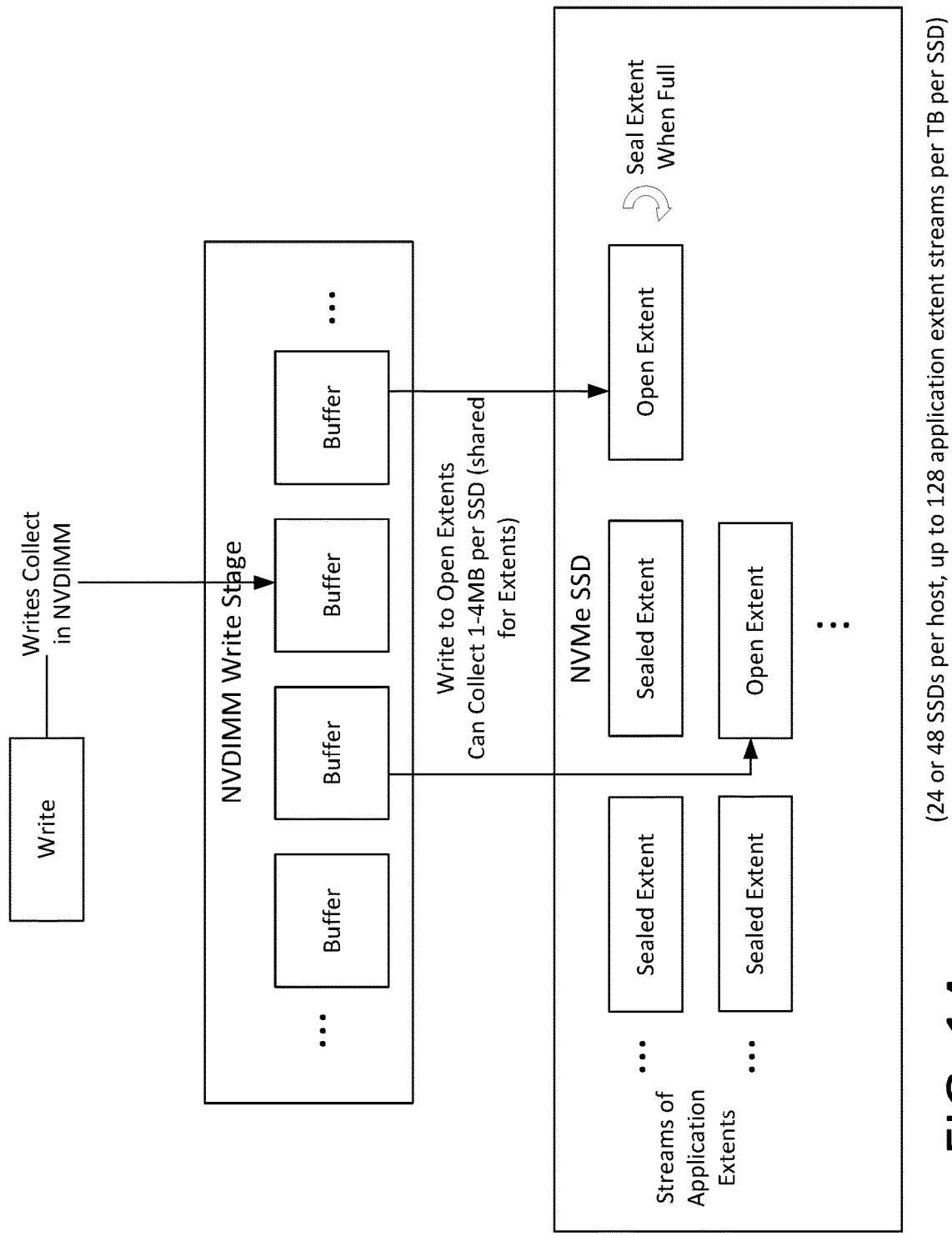
FIG. 14 shows example details of a write operation using the append only streaming methods disclosed herein.

FIG. 14 shows a block diagram of an example write operation using the append only streaming methods disclosed herein. As shown in the figure, an append only system may be utilized with primary storage on an SSD, including a small non-volatile dual in-line memory module (NVDIMM) write stage. Data may be organized in streams of extents, with all extents being sealed and read-only except the last one that is active for appends. An extent may be an area of storage in a file system reserved for data storage. As shown in FIG. 14, the NVDIMM write stage may allow the system to collect small (e.g., 4-64 kb) user writes that may be destaged as large sequential writes (e.g., 1 MB) to the SSDs on a per-extent basis. When sufficient data within file system data extents has been invalidated, valid data may be garbage collected by the host to a new extent, and the old extent may be trimmed as a whole. This process may be the responsibility of the host (e.g., the file system). The file system may support data extents of variable sizes, with typical extent sizes being 256 MB.

Write amplification of the SSDs can be nearly eliminated by matching application data extent size to the SSD's unit of garbage collection by tailoring data extents to be a multiple of the erase block size. Flexible throughput of the application data extents can be obtained by controlling the number of erase blocks to stripe against (e.g., can stripe against all dies, or can stripe against a smaller number of blocks). As the workload may be append only, metadata for stream mapping may be minimized. Thus, the SSD may only need to track a list of blocks and maintain an internal write pointer where the next host appending writes will occur. This operation may be on a per-stream basis.

Figure 15:
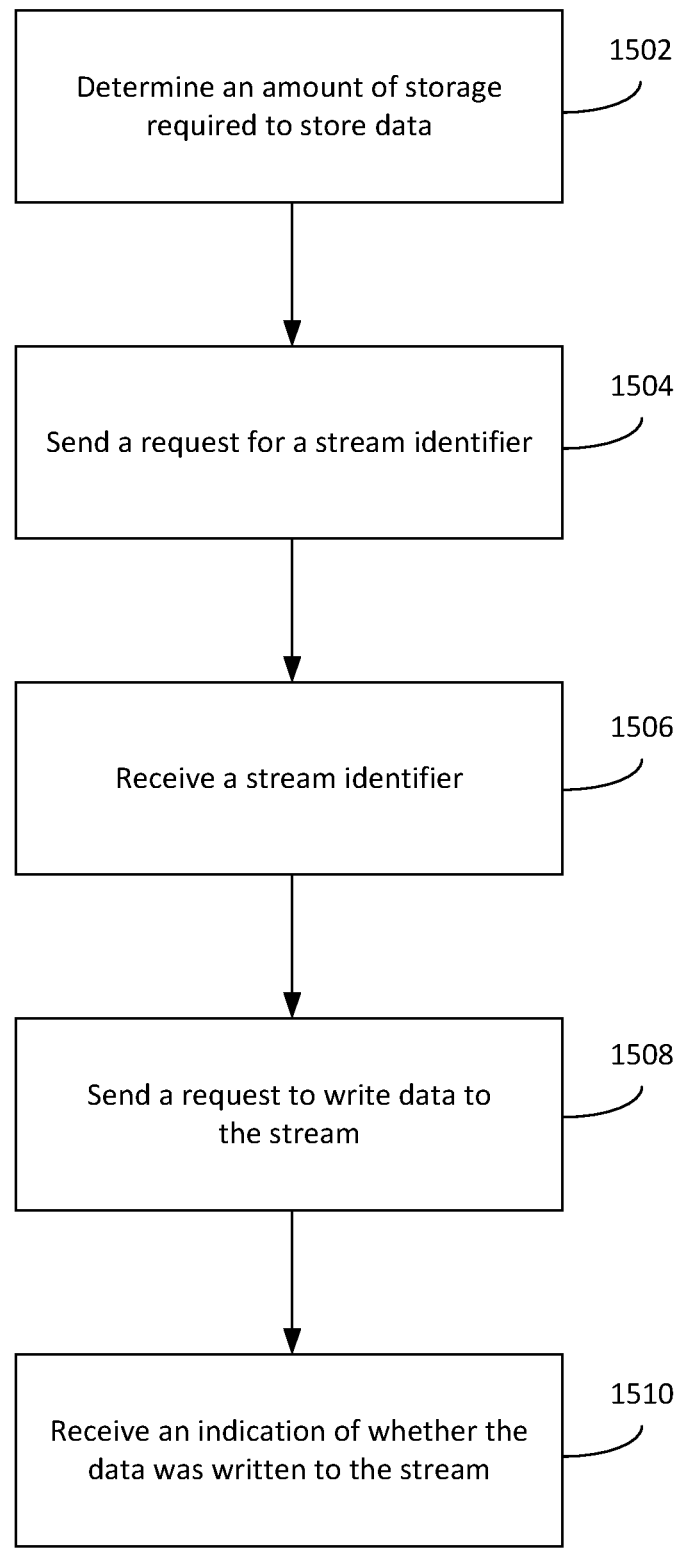
FIG. 15 shows a flow chart of an example method performed by a file system for writing data to a stream using append-only streaming.

FIG. 15 shows a flow chart of an example method for writing data to a stream using the append-only streaming capabilities disclosed herein. At step 1502, a file system may determine an amount of storage capacity required to store data on a device. The device may be a solid state device, such as the SSD 200 shown in FIG. 2. The file system may be the file system 502 shown in FIG. 5. Determining an amount of storage capacity required to store data on the device may comprise determining a number of erase blocks of the solid state device required to store the data. As discussed herein, an erase block such as the erase blocks 208 shown in FIG. 2 may be the smallest unit of the SSD that is capable of being erased. The file system may determine the number of erase blocks needed to store the data based on the amount of data needed to be stored and the size of the one or more erase blocks of the device. The data to be stored in the one or more erase blocks may be related such that all of the data is to be deleted from the device at the same time.

At step 1504, the file system may send to the device a request for one or more stream identifiers. Each of the stream identifiers may be associated with a given stream of the device. The stream may comprise one or more of the erase blocks of the device as determined by the file system in step 1502. The request for the one or more stream identifiers may comprise an indication of the number of erase blocks required to store the data. For example, the file system may determine that each erase block of the SSD can store 256 KB of data, and that 1 MB of data needs to be stored on the device. Thus, the file system may request from the SSD a stream comprising four erase blocks.

At step 1506, the file system may receive from the device the one or more stream identifiers. The device may be configured to determine one or more stream identifiers based on the number of erase blocks requested by the file system. For example, the device may determine that there are three separate streams on the device comprising four erase blocks. The device may send to the file system a stream identifier associated with a given one of those streams. If the device does not have any streams that comprise four erase blocks, the device may send to the file system a stream identifier associated with a stream that comprises a different number of erase blocks, such as six erase blocks or three erase blocks. Additionally or alternatively, the device may create a stream based on the request from the file system. In another example, the device may send to the file system an indication that there are no available streams that meet the requested criteria.

In the example that the device comprises multiple streams with four erase blocks, the device may send to the file system each of the stream identifiers associated with those streams. The file system may select the appropriate stream based on one or more characteristics of the streams. In the example that the device does not comprise any streams with four erase blocks, the file system may send to the device an updated request for a stream having a different number of erase blocks. Additionally or alternatively, the file system may send to the device a request to create a stream comprising the desired number of erase blocks, and may receive from the device a stream identifier associated with the created stream.

At step 1508, the file system may send to the device a request to write data to the stream. The device, upon receiving the request from the file system, may be configured to write the data to the one or more erase blocks in the stream. The data may be written to the stream one erase block at a time. For example, a first portion of the data may be written to a first one of the erase blocks, then a second portion of the data may be written to a second one of the erase blocks, etc. Alternatively, data may be written to the one or more erase blocks of the stream simultaneously, such that one or more of the erase blocks are being addressed at the same time. The file system and the device may communicate using the one or more stream identifiers. As discussed herein, it may not be necessary for the file system to know the LBA location of the erase blocks on the device. In one example, the request to write data to the stream may comprise an append operation to the last (e.g., most recent) write operation in the stream.

At step 1510, the file system may receive from the device an indication of whether the data was written to the stream. For example, the file system may receive an indication that all of the data was written to the stream. The file system may receive an indication that none of the data was written to the stream. The file system may receive an indication that only a portion of the data was written to the stream. Further details of operations performed by the file system in response to the indication of whether or not the data was written to the stream are shown in FIGS. 16 and 17.

Figure 16:
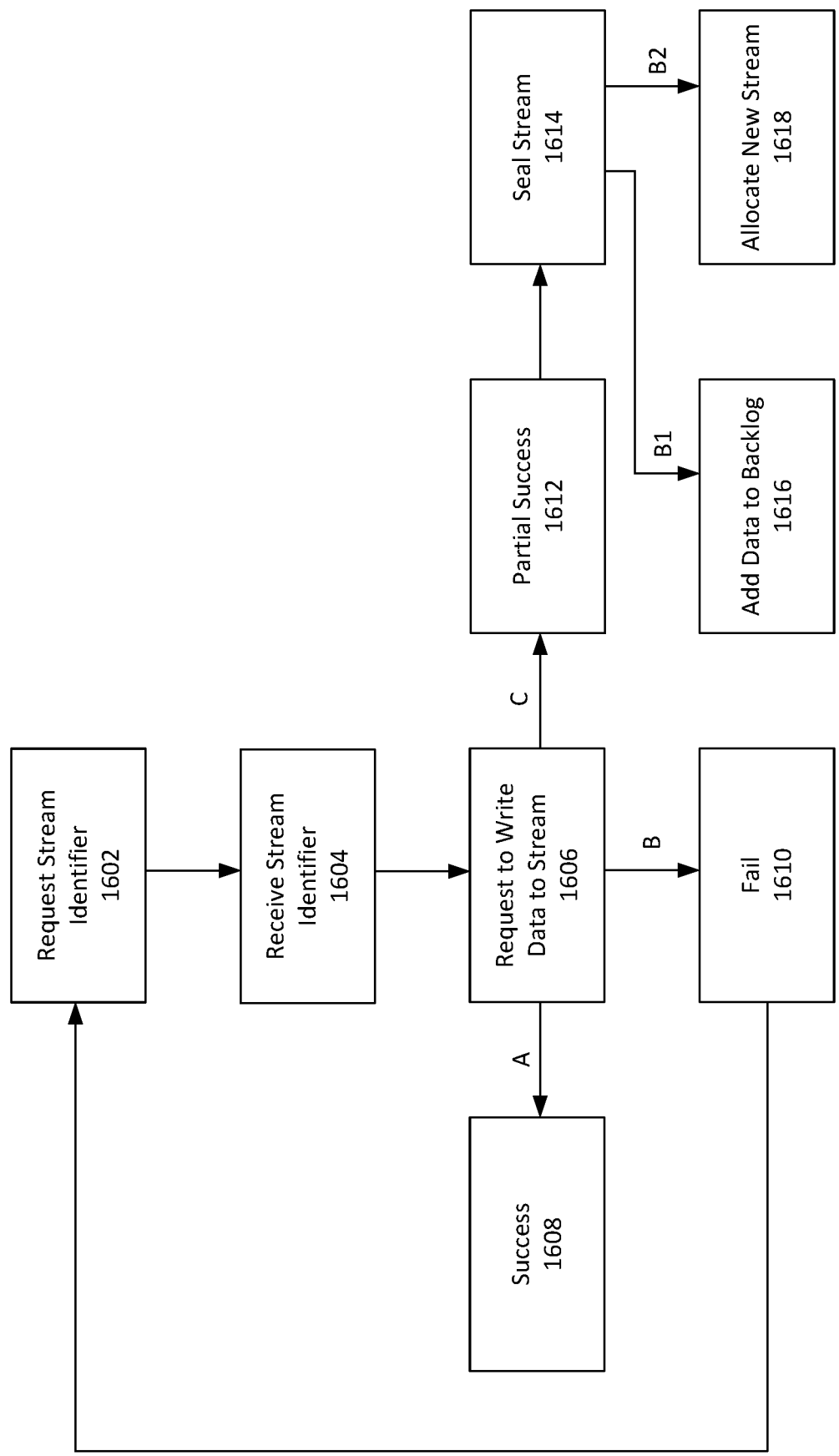
FIG. 16 shows further details of a method for writing data to a stream.
Figure 17:
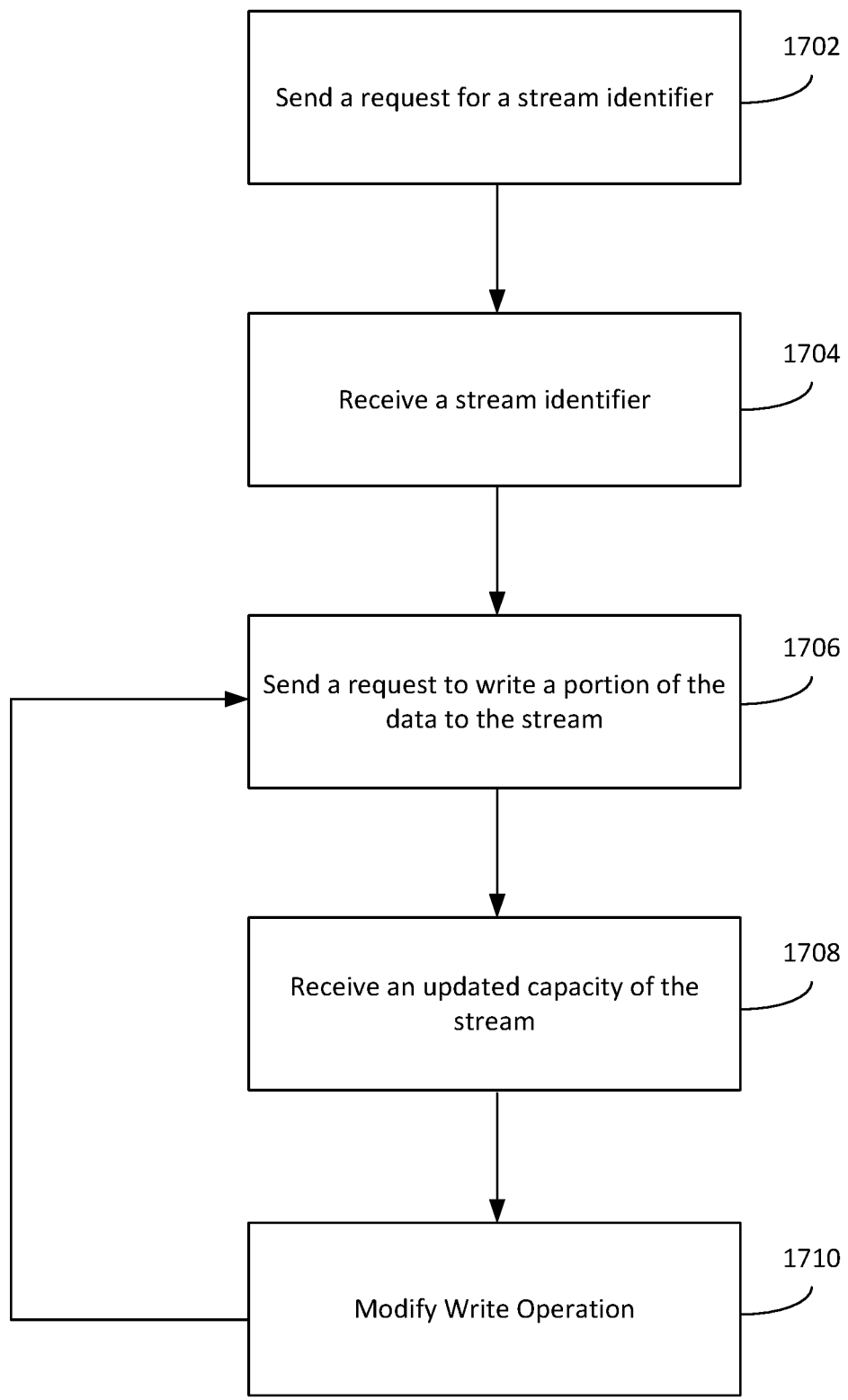
FIG. 17 shows further details of a method for writing data to a stream.

FIG. 16 shows a flow chart of an example method for writing data to a stream in accordance with an aspect of the disclosure. At step 1602, a file system may send to a device a request for one or more stream identifiers for writing data to the device. Each of the stream identifiers may be associated with a given stream of the device. The request for the one or more stream identifiers may comprise an indication of the number of erase blocks required to store the data. The file system may determine an amount of data that needs to be stored on the device and the storage capacity of one or more erase blocks of the device. Based on this information, the file system may calculate the number of erase blocks needed to store the data, and may request a stream identifier associated with a stream comprising the determined number of erase blocks.

At step 1604, the file system may receive from the device the one or more stream identifiers. The device may be configured to determine one or more stream identifiers based on the number of erase blocks requested by the file system. For example, the device may determine that there are three separate streams on the device comprising four erase blocks. The device may send to the file system a stream identifier associated with a given one of those streams. If the device does not have any streams that comprise four erase blocks, the device may send to the file system a stream identifier associated with a stream that comprises a different number of erase blocks, such as six erase blocks or three erase blocks. Additionally or alternatively, the device may create a stream based on the request from the file system.

At step 1606, the file system may send to the device a request to write data to the stream. However, it is possible that between the time the stream identifier was allocated and the time of the request to write the data to the stream, conditions at the stream have changed that may impact the write operation. For example, NAND pages may have a limit to the amount of lifetime writes that they can accept before their electrical signal is too weak to persist data for a sufficient duration. Erase units may be significantly larger than the program unit, thus the device may need to be intelligent on selection to minimize the amount of data that is "over read." Reading data may reduce the electrical charge within a NAND cell, and over time the charge may drop to low enough levels that put the data at risk of permanent loss. The device may internally maintain a mapping of the voltages and rewrite/refresh the data as-needed. This may consume write cycles and internal bandwidth.

The device may periodically perform "scrubbing operations" or background checks which make sure the integrity of the NAND cell is upheld. Between the time of allocating the stream identifier and the time of the attempted write operation, a scrubbing operation may reveal that one or more of the erase blocks in the stream have become defective. The device may send to the file system one of a plurality of indicators based on the success or failure of the write operation:

At step 1608, the device may send to the file system an indication that all of the data was written to the stream. In this example, the conditions of the device may not have changed since the request of the stream identifier and the time of the write operation, and all of the data may be written to the erase blocks of the stream as originally contemplated by the file system and/or the device. Alternatively, the conditions of the device may have changed only slightly such that all of the data may still be written to the stream without complication.

At step 1610, the device may send to the file system an indication that none of the data could be written to the stream. This may occur when the conditions of the device have changed drastically such that the one or more erase blocks originally allocated to the stream are no longer capable of receiving data. For example, the entire die that comprises the erase blocks may have lost its charge, thereby rendering each of the erase blocks incapable of receiving write operations. Alternatively, the conditions of the erase blocks may have changed only slightly, but the device may determine that if all of the data can not be written to the stream, then none of the data should be written to the stream.

At step 1612, the device may send to the file system an indication that only a portion of the data was written to the stream. This may occur when the conditions of the device have changed such that one or more erase blocks originally allocated to the stream are no longer capable of being written to. In this example, as shown at step 1614, the device may seal the stream. In other words, the device may determine that the stream is full and may prevent any more data from being written to the stream. The device may send to the host an indication that the stream identifier is no longer available. At step 1616, the file system, upon receiving the indication that only a portion of the data was written to the stream, may be configured to add the data to a backlog of the file system to be stored at a later time. Additionally or alternatively, at step 1618, the file system may send to the device a request for one or more other stream identifiers for writing the remainder of the data to the device.

FIG. 17 shows a flow chart of an example method for writing data to a stream in accordance with another aspect of the disclosure. At step 1702, a file system may send to a device a request for one or more stream identifiers for writing data to the device. Each of the stream identifiers may be associated with a given stream of the device. The request for the one or more stream identifiers may comprise an indication of the number of erase blocks required to store the data. The file system may determine an amount of data that needs to be stored on the device and the storage capacity of one or more erase blocks of the device. Based on this information, the file system may calculate the number of erase blocks needed to store the data, and may request a stream identifier associated with a stream comprising the determined number of erase blocks.

At step 1704, the file system may receive from the device the one or more stream identifiers. The device may be configured to determine one or more stream identifiers based on the number of erase blocks requested by the file system. For example, the device may determine that there are three separate streams on the device comprising four erase blocks. The device may send to the file system a stream identifier associated with a given one of those streams. If the device does not have any streams that comprise four erase blocks, the device may send to the file system a stream identifier associated with a stream that comprises a different number of erase blocks, such as six erase blocks or three erase blocks. Additionally or alternatively, the device may create a stream based on the request from the file system.

At step 1706, the file system may send to the device a request to write a portion of the data to the stream. The device, upon receiving the request from the file system, may attempt to write the portion of the data to the one or more erase blocks in the stream. However, it is possible that between the time the stream identifier was allocated and the time of the request to write the data to the stream, conditions at the stream have changed (e.g., reduced cell charge) that may impact the write operation.

At step 1708, the file system may receive an updated capacity of the stream. In one example, the file system may be configured to periodically send to the device a request to determine an updated capacity of the stream. In another example, the file system may request an updated capacity of the stream in response to receipt from the device of an indication that a portion of the data could not be written to the stream. In another example, the device may automatically send to the file system an updated capacity of the stream in response to a determination that a portion of the data could not be written to the stream. An example stream may comprise four erase blocks each comprising 10 KB of storage. Thus, the stream may comprise a total of 40 KB of storage. However, it may be possible that one of the erase blocks in the stream becomes defective (e.g., loses its charge) such that the stream may only be able to store 30 KB of data.

At step 1710, the file system may update its write operations based on the updated storage capacity of the stream. The device may be configured to write to the erase blocks at an optimal write size of 8 KB. The file system may perform a first write operation to the device such that the stream comprises 8 KB of data. The file system may then perform a second write operation such that the stream comprises 16 KB of data. At this point, the file system may receive the updated storage capacity of the stream (i.e., 30 KB) and may determine that there is sufficient capacity for another write operation. The file system may then perform a third write operation such that the stream comprises 24 KB of data. However, because the stream cannot handle another 8 KB write operation, the file system may determine to perform a fourth write operation of 4 KB, such that the stream comprises 28 KB of data. The file system may again receive an updated stream capacity from the device. If the capacity of the stream remains at 30 KB, the file system may again modify its write operation to write another 2 KB of data to the stream. However, if the file system receives an indication that the capacity of the stream has decreased even further, it may cease writing to the stream or may further modify its write operations based on the updated capacity of the stream.

As discussed herein, it may not be possible for a stream to be kept open indefinitely due to physical constraints on the NAND. However, an append only stream may optionally be kept open indefinitely where the device will append a minimal amount of filler data to satisfy minimal NAND cell charge needs. When the host reads the data, the SSD may optionally truncate the namespace of the stream or the device, and skip over the areas which have been internally tracked as filler data, returning only valid data. Alternatively, the SSD may return a well known pattern of filler data. In one example, the file system should be able to hide this filler data from applications that are using files on the file system. In another example, the application may be told that filler data is being returned.

Host devices typically interact with storage devices based on logical block address (LBA) mappings to read/write data. File systems may maintain metadata to present application/user-friendly access points known as files which may be accessed by file name/ID & an offset. When reading/writing to or from a block-addressed device, the host may specify a LBA mapping (e.g., a starting block and length). When reading/writing to or from a stream-addressed device, the host may specify a stream ID and optionally an offset and length. In one example, the offset may be located within the stream.

A file system may interact with streaming devices using different operating modes. For example:

For a device with no streams, a block addressed operating mode may be used;

For a device with random-access streams, a block addressed operating mode may be used;

For a device with one or more random-access streams where all other streams are append-only, a block-addressed operating mode may be used;

For a device with one or more random-access streams which are block-addressed in one namespace and in another namespace all streams are append-only, the append-only streams may be stream addressed; and For a device with all append-only streams, a stream-based operating mode may be used.

A file system may use stream semantics to read/write user data, maintain file system metadata in at least one of its own append only streams, in a random access stream, or on a block-addressed portion of the namespace. The file system may be flexible to manage the relationship between append only streams and files, where an append only stream can be mapped to one or multiple files, or vice-versa. Files or objects managed by the file system may have data "pinned" to one or more append only streams as needed, where new allocations would only occur within those streams. The file system may seamlessly manage portions of files which are stream-addressed and block-addressed, presenting a consistent view to the front-end.

Append only streams may be flexible entities and the file system can take advantage of that property by optionally choosing to create an append only stream which stripes across all of the available dies to maximize throughput, create append only streams which only utilize half of the available dies to reduce interference, and/or create append only streams which only use a single die to maximize writable capacity due to media defects or errors.

The file system may support front-end random-write access to an append only stream by converting that access to appends in an append only stream. Any writes to previous data will effectively create "holes" in the append only stream of invalid data, and updates may be appended to the append only stream.

The file system may perform garbage collection of streams when the amount of invalid data within the stream exceeds internal thresholds and/or upon admin/application initiated triggers. This may comprise reading the data of the old stream, transforming it in memory (typically to coalesce data), and then writing it to a new stream. The actual data movement can also be offloaded to reduce host-device IO activity.

The file system may support flexible extent sizing to better cooperate with the structure of the underlying flash. The extent sizes may be shrunk if needed to handle errors. The file system may deal with errors encountered when appending to a stream by sealing its extent early and abandoning it, re-writing it to another stream, or treating the already-written data as valid. This may be referred to as "fast-fail." Instead of the device performing extraordinary means to satisfy the write or performing its own re-allocations, the device may simply give up quickly to allow for the system to quickly recover and send the write elsewhere. This may reduce typical recovery that can take on the order of seconds, which is impactful to a cloud-scale system. Thus, it may be desirable to quickly abandon the task and try elsewhere.

The file system can participate in keeping NAND blocks/streams open for a period of time for writing related data instead of having the device close them after a timer has elapsed. When the device operates in this mode, it may independently write sufficient filler data to keep the block open to satisfy voltage requirements. The device may then advance the write pointer and track how much data is remaining in the stream or block. The file system may write the filler data. Alternatively, the device can write the filler data and track the garbage region. The file system may either identify the filler data when reading and skip over it (changing the run table mapping), or the device can truncate the stream and automatically skip over the data when reading.

The file system may receive information from the underlying NAND cells on the voltage health state, either in the form of vendor-specific predictive failure data, or in raw voltage data with vendor-specific threshold information. With this information, the file system may make determinations when/if garbage collection is needed to prevent the data from being destroyed. Voltages can drop slowly over time, upon heavy over-read activity, or after the device is powered off for a period of time.

The file system may choose to abandon the data instead of performing garbage collection if for instance the data is no longer needed (e.g., due to overwrites) or there are sufficient copies maintained in another device. Typically, the device may be configured to always perform garbage collection when the voltage sags sufficiently low. This however is not always needed.

The file system may have better knowledge of the nature of the data than the underlying device, and thus it can perform larger units of garbage collection or coalescing than NAND can, which typically does this in units of the erase unit. Overall, this reduces the amount of write amplification that is needed to maintain the health of the NAND due to voltage sag.

Instead of the file system performing the read and rewrite of the data, it may optionally offload this operation to the device by specifying a new stream to write the data to, or another existing stream to append the data to. This may cover other offload data operations such as coalescing, trim, etc.

When a file system is operating on a stream based device, it may abstract an LBA interface on top of the stream device to support applications which are not aware of stream based addressing.

A new command may be configured to prepare an append only stream for writes. This command may be called by the host when allocating a new application data extent, where one or more application extents are mapped to a stream. The input may comprise the number of erase blocks to write across and the stream ID to write to, and the maximum number of writeable space when writing striped across the desired number of erase blocks (accounting for page defects) may be returned. In one example, when writing in append only mode, a minimum of 128 streams/TB and two random access streams may be provided. Support may also be provided for implicit opens of streams.

Figure 18:
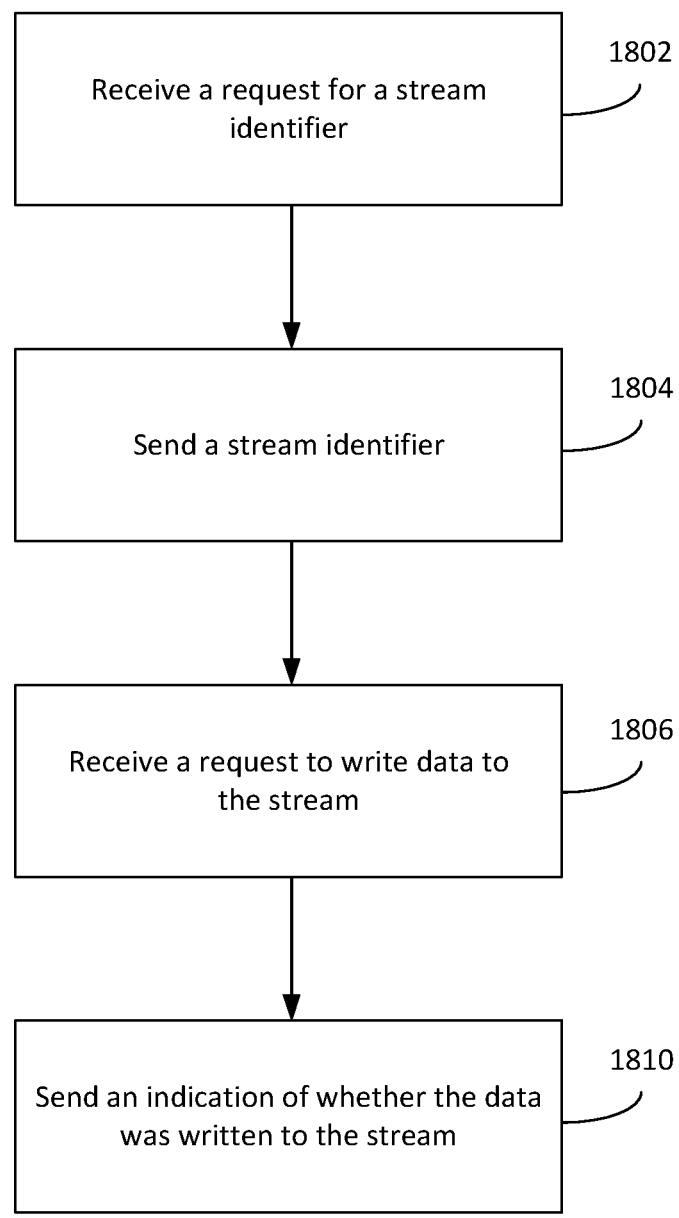
FIG. 18 shows a flow chart of an example method performed by a storage device for writing data to a stream using append-only streaming.

FIG. 18 shows a flow chart of an example method for writing data to a stream. At step 1802, a device may receive from a file system a request for a stream identifier. Each of the stream identifiers may be associated with a given stream of the device. The request for the one or more stream identifiers may comprise an indication of the number of erase blocks required to store the data. The file system may determine an amount of data that needs to be stored on the device and the storage capacity of one or more erase blocks of the device. Based on this information, the file system may calculate the number of erase blocks needed to store the data, and may request from the device a stream identifier associated with a stream comprising the determined number of erase blocks. For example, the file system may determine that each erase block of the SSD can store 256 KB of data, and that 1 MB of data needs to be stored on the device. Thus, the file system may request from the SSD a stream comprising four erase blocks.

At step 1804, the device may send to the file system the one or more stream identifiers. The device may be configured to determine one or more stream identifiers based on the number of erase blocks requested by the file system. For example, the device may determine that there are three separate streams on the device comprising four erase blocks. The device may send to the file system a stream identifier associated with a given one of those streams. If the device does not have any streams that comprise four erase blocks, the device may send to the file system a stream identifier associated with a stream that comprises a different number of erase blocks, such as six erase blocks or three erase blocks. Additionally or alternatively, the device may create a stream based on the request from the file system. In another example, the device may send to the file system an indication that there are no available streams that meet the requested criteria.

In the example that the device comprises multiple streams with four erase blocks, the device may send to the file system each of the stream identifiers associated with those streams.

The file system may select the appropriate stream based on one or more characteristics of the streams. In the example that the device does not comprise any streams with four erase blocks, the file system may send to the device an updated request for a stream having a different number of erase blocks. Additionally or alternatively, the file system may send to the device a request to create a stream comprising the desired number of erase blocks, and may receive from the device a stream identifier associated with the created stream.

At step 1806, the device may receive from the file system a request to write data to the stream. The device, upon receiving the request from the file system, may be configured to write the data to the one or more erase blocks in the stream. The data may be written to the stream one erase block at a time. For example, a first portion of the data may be written to a first one of the erase blocks, then a second portion of the data may be written to a second one of the erase blocks, etc. Alternatively, data may be written to the one or more erase blocks of the stream simultaneously, such that one or more of the erase blocks are being addressed at the same time. The file system and the device may communicate using the one or more stream identifiers. As discussed herein, it may not be necessary for the file system to know the LBA location of the erase blocks on the device.

At step 1808, the device may send to the file system an indication of whether the data was written to the stream. For example, the file system may receive an indication that all of the data was written to the stream. The file system may receive an indication that none of the data was written to the stream. The file system may receive an indication that only a portion of the data was written to the stream.

Figure 19:
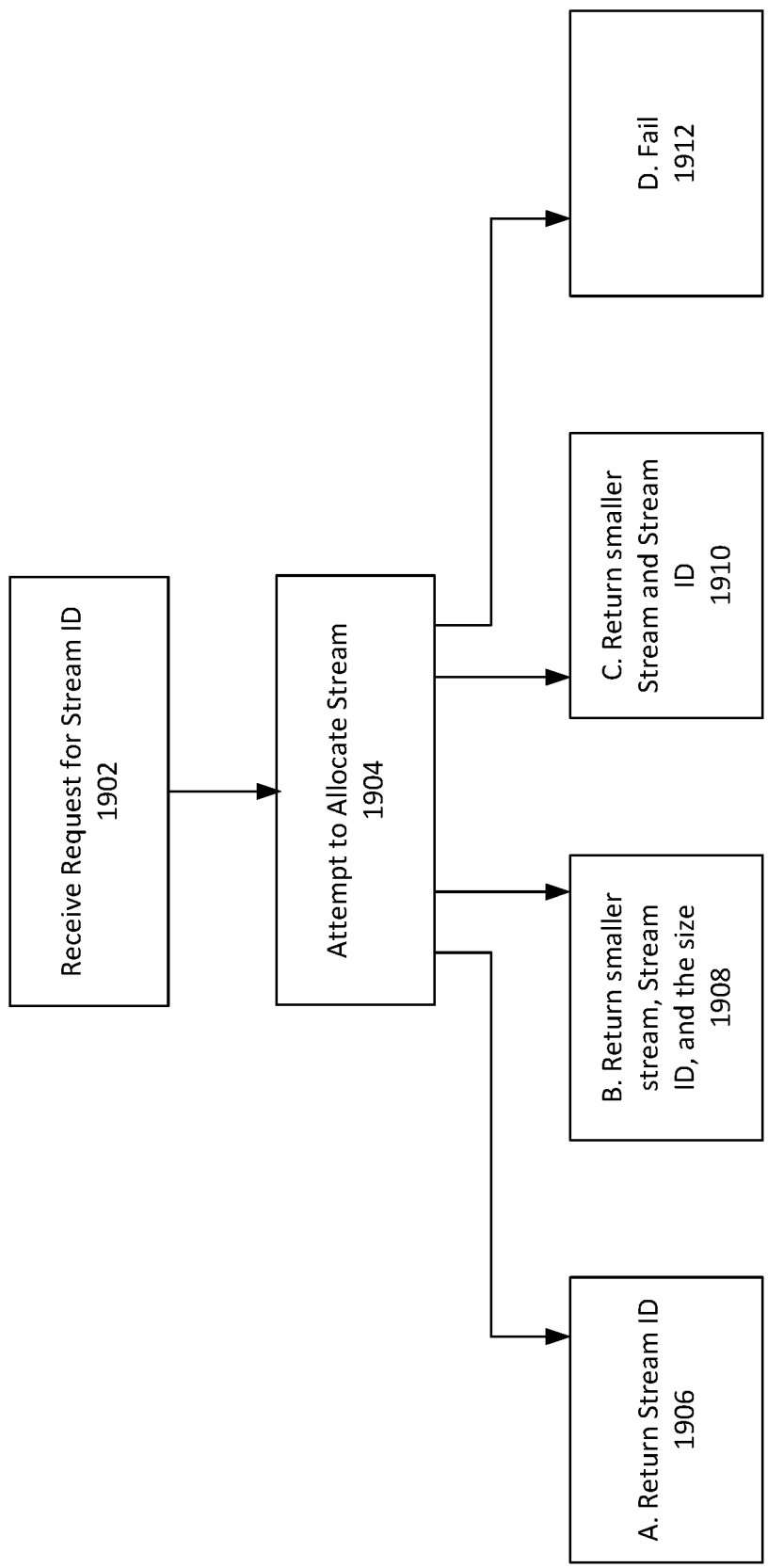
FIG. 19 shows a flow chart of an example method for stream allocation by the storage device.

FIG. 19 shows a flow chart of an example method for stream allocation by the storage device. At step 1902, the device may receive from a file system a request for a stream identifier. Each of the stream identifiers may be associated with a given stream of the device. The request for the one or more stream identifiers may comprise an indication of the number of erase blocks required to store the data. The file system may determine an amount of data that needs to be stored on the device and the storage capacity of one or more erase blocks of the device. Based on this information, the file system may calculate the number of erase blocks needed to store the data, and may request from the device a stream identifier associated with a stream comprising the determined number of erase blocks.

At step 1904, the device may attempt to allocate the stream. The device may receive from the file system the number of erase blocks needed to store the data requested by the file system. The device may determine whether one or more streams on the device meet the criteria, or whether a stream can be created on the device that meets the necessary criteria, and may send an indication to the file system as shown in steps 1906-1912.

At step 1906, if the requested stream size is available, the device may return to the file system a stream identifier associated with a stream comprising the desired number of erase blocks. For example, if the file system requested a stream comprising four erase blocks, the device may send to the file system an identifier associated with a stream that comprises four erase blocks. On the other hand, if the device does not have any available streams of the requested size and/or does not have the capacity to generate a new stream of the requested size, the device may perform any one of the steps shown in steps 1908, 1910 or 1912.

At step 1908, the device may send to the file system a smaller stream and an identifier associated with the smaller stream. The device may additionally send to the file system the actual size of the smaller stream. For example, the device may send to the file system an indication that the stream comprises three erase blocks instead of the requested four erase blocks, or that the stream has a storage capacity of 500 KB instead of 1 MB as requested. At step 1912, the device may send to the file system a smaller stream and the identifier associated with the smaller stream without sending to the file system the actual size of the stream. The file system may query the device for the actual size of the stream at a later time, if needed. At step 1914, the device may send to the file system an indication that no streams of that size are available. The file system, in response, may send to the device a request for a smaller stream as discussed above.

The illustrations of the aspects described herein are intended to provide a general understanding of the structure of the various aspects. The illustrations are not intended to serve as a complete description of all of the elements and features of apparatus and systems that utilize the structures or methods described herein. Many other aspects may be apparent to those of skill in the art upon reviewing the disclosure. Other aspects may be utilized and derived from the disclosure, such that structural and logical substitutions and changes may be made without departing from the scope of the disclosure. Accordingly, the disclosure and the figures are to be regarded as illustrative rather than restrictive.

The various illustrative logical blocks, configurations, modules, and method steps or instructions described in connection with the aspects disclosed herein may be implemented as electronic hardware or computer software. Various illustrative components, blocks, configurations, modules, or steps have been described generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the present disclosure.

The various illustrative logical blocks, configurations, modules, and method steps or instructions described in connection with the aspects disclosed herein, or certain aspects or portions thereof, may be embodied in the form of computer executable instructions (i.e., program code) stored on a computer-readable storage medium which instructions, when executed by a machine, such as a computing device, perform and/or implement the systems, methods and processes described herein. Specifically, any of the steps, operations or functions described above may be implemented in the form of such computer executable instructions. Computer readable storage media include both volatile and nonvolatile, removable and non-removable media implemented in any non-transitory (i.e., tangible or physical) method or technology for storage of information, but such computer readable storage media do not include signals. Computer readable storage media include, but are not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other tangible or physical medium which may be used to store the desired information and which may be accessed by a computer.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

The description of the aspects is provided to enable the making or use of the aspects. Various modifications to these aspects will be readily apparent, and the generic principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed:

1. A method comprising:
   determining, by a file system of a computing device, a number of erase blocks required for storing data on a solid state device, wherein the number of erase blocks is determined based on the data to be stored and an indication, received from the solid state device, of a size of the erase blocks of the solid state device;
   sending, by the file system and to the solid state device, based on determining the number of erase blocks for storing data on the solid state device, a request for a stream identifier associated with a stream that comprises at least the determined number of erase blocks;
   receiving, by the file system and from the solid state device, the stream identifier;
   sending, by the file system and to the solid state device, a request for a data write operation to write the data to the stream, the request comprising the stream identifier associated with the stream; and
   receiving, by the file system and from the solid state device, an indication of whether the data was written to the stream.

2. The method of claim 1, wherein receiving the stream identifier comprises receiving a plurality of stream identifiers; and wherein sending the request to write data to the stream comprises selecting a given one of the stream identifiers.

3. The method of claim 1, wherein the request to write data to the stream comprises an append operation that enables an optimal size for the stream to be determined based on the data to be stored in that stream.

4. The method of claim 1, further comprising:
   sending, to the device, a request to determine an available capacity of the stream;
   receiving, from the device, the available capacity of the stream; and
   sending, to the device and based on the available capacity of the stream, an updated request to write data to the stream.

5. The method of claim 1, wherein the indication comprises an indication that the data was not written to the stream.

6. The method of claim 5, further comprising sending, to the solid state device, at least one of:
   an updated request for one or more stream identifiers; or
   an updated request to write data to the stream, the updated request comprising a request to write a smaller portion of the data to the stream.

7. The method of claim 1, wherein the indication comprises an indication that a portion of the data was not written to the stream.

8. The method of claim 7, further comprising at least one of:
   storing the data in a local memory; and
   sending, to the device, a request for one or more other stream identifiers for writing the portion of the data.

9. A computing device comprising a processing unit, a memory, and a file system executing on the processing unit, the file system when executing on the processing unit performing operations comprising:
   determining a number of erase blocks required for storing data on a solid state device, wherein the number of erase blocks is determined based on the data to be stored on the device and an indication of a size of the erase blocks received from the solid state device;
   sending, to the device, based on determining the number of erase blocks for storing data on the device, a request for a stream identifier associated with a stream that comprises the determined number of erase blocks;
   receiving, from the device, the stream identifier;
   sending, to the device, a request to write data to a stream, the request comprising the stream identifier associated with the stream; and
   receiving, from the device, an indication of whether the data was written to the stream.

10. The computing device of claim 9, wherein receiving the stream identifier comprises receiving a plurality of stream identifiers; and wherein sending the request to write data to the stream comprises selecting a given one of the stream identifiers.

11. The computing device of claim 9, wherein the request to write data to the stream comprises an append operation that enables an optimal size for the stream to be determined based on the data to be stored in that stream.

12. The computing device of claim 9, wherein the file system performs additional operations comprising:
   sending, to the device, a request to determine an available capacity of the stream;
   receiving, from the device, the available capacity of the stream;
   sending, to the device and based on the available capacity of the stream, an updated request to write data to the stream.

13. The computing device of claim 9, wherein the indication comprises an indication that the data was not written to the stream.

14. The computing device of claim 13, wherein the file system performs additional operations comprising sending, to the device, at least one of:
   an updated request for one or more stream identifiers; or
   an updated request to write data to the stream, the updated request comprising a request to write a smaller portion of the data to the stream.

15. The computing device of claim 9, wherein the indication comprises an indication that a portion of the data was not written to the stream.

16. The computing device of claim 15, wherein the file system performs additional operations comprising at least one of:
   storing the data in a local memory; and
   sending, to the device, a request for one or more other stream identifiers for writing the portion of the data.

17. A method comprising:
   sending, to a file system by a solid state device, an indication of a size of one or more erase blocks of the solid state device;
   receiving, from the file system by the solid state device, a request for a stream identifier associated with a stream that comprises a number of erase blocks, the request being sent by the file system based on the file system determining, from the indicated size of the one or more erase blocks, a number of erase blocks required for storing an amount of data on the storage device;

sending, to the file system by the solid state device, the stream identifier of a stream comprising at least the number of requested erase blocks;

receiving, from the file system and by the solid state device, a request to write data to a stream, the request comprising the stream identifier;

writing, by the solid state device, at least a portion of the data to the stream; and sending, to the file system by the solid state device, an indication of whether the data was written to the stream.

18. The method of claim 17, wherein sending the stream identifier comprises sending a plurality of stream identifiers; and wherein receiving the request to write data to the stream comprises receiving a selected one of the stream identifiers.

19. The method of claim 17, further comprising:

receiving, from the file system, a request to determine an available capacity of the stream;

sending, to the file system, the available capacity of the stream; and receiving, from the file system and based on the available capacity of the stream, an updated request to write data to the stream.

20. The method of claim 17, wherein the request to write data to the stream comprises an append operation that enables an optimal size for the stream to be determined based on the data to be stored in that stream.

* * * * *